(12) United States Patent
Han et al.

(10) Patent No.: US 11,362,143 B2
(45) Date of Patent: Jun. 14, 2022

(54) NONVOLATILE MEMORY DEVICE HAVING THREE-DIMENSIONAL STRUCTURE

(71) Applicant: SK hynix Inc., Icheon-si (KR)

(72) Inventors: Jae Hyun Han, Icheon-si (KR); Hyangkeun Yoo, Seongnam-si (KR); Se Ho Lee, Yongin-si (KR)

(73) Assignee: Sk hynix Inc., Icheon-si (KR)

( * ) Notice: Subject to any disclaimer, the term of this patent is extended or adjusted under 35 U.S.C. 154(b) by 141 days.

(21) Appl. No.: 16/941,155

(22) Filed: Jul. 28, 2020

(65) Prior Publication Data

US 2021/0257407 A1 Aug. 19, 2021

(30) Foreign Application Priority Data

Feb. 13, 2020 (KR) .................. 10-2020-0017890

(51) Int. Cl.
```
H01L 27/24       (2006.01)
H01L 29/06       (2006.01)
H01L 27/1159     (2017.01)
H01L 27/11582    (2017.01)
H01L 27/11524    (2017.01)
H01L 27/11556    (2017.01)
H01L 27/1157     (2017.01)
H01L 27/11597    (2017.01)
H01L 29/423      (2006.01)
H01L 21/28       (2006.01)
```
(52) U.S. Cl.
CPC ...... *H01L 27/249* (2013.01); *H01L 21/28114* (2013.01); *H01L 27/1157* (2013.01); *H01L 27/1159* (2013.01); *H01L 27/11524* (2013.01); *H01L 27/11556* (2013.01); *H01L 27/11582* (2013.01); *H01L 27/11597* (2013.01); *H01L 27/2454* (2013.01); *H01L 29/0649* (2013.01); *H01L 29/42376* (2013.01)

(58) Field of Classification Search
CPC ............ H01L 27/249; H01L 27/11556; H01L 27/11582; H01L 27/11597; H01L 27/11578; H01L 21/28114; H01L 29/42372–4238
See application file for complete search history.

(56) References Cited

U.S. PATENT DOCUMENTS

2012/0112156 A1  5/2012 Park et al.
2017/0005137 A1  1/2017 Kim

*Primary Examiner* — Amar Movva

(57) ABSTRACT

A nonvolatile memory device according to an embodiment includes a substrate, and a gate structure disposed on the substrate and including a hole pattern. The gate structure includes at least one gate electrode layer and at least one interlayer insulation layer which are alternately stacked, and the gate electrode layer protrudes toward a center of the hole pattern relative to the interlayer insulation layer. The nonvolatile memory device includes a first functional layer disposed along a sidewall surface of the gate structure inside the hole pattern, a second functional layer disposed on the first functional layer inside the hole pattern, and a channel layer extending in a direction perpendicular to the substrate inside the hole pattern and disposed to contact a cell portion of the second functional layer. The cell portion of the second functional layer indirectly covers a sidewall surface of the gate electrode layer.

20 Claims, 38 Drawing Sheets

NONVOLATILE MEMORY DEVICE HAVING THREE-DIMENSIONAL STRUCTURE

CROSS-REFERENCE TO RELATED APPLICATIONS

The present application claims priority under 35 U.S.C. § 119(a) to Korean Application No. 10-2020-0017890, filed on Feb. 13, 2020, which is incorporated herein by reference in its entirety.

BACKGROUND

1. Technical Field

The present disclosure generally relates to a nonvolatile memory device and, more particularly, to a nonvolatile memory device having a three-dimensional structure.

2. Related Art

According to the trends of decreasing design rules and increasing degree of integration, research on the structures of semiconductor devices that can guarantee both structural stability and reliability of signal storage operation has continued. That is, techniques have been studied for increasing the density of memory cells through a reduction in the memory cell area while preventing signal interference between neighboring memory cells to improve reliability of stored signal information.

SUMMARY

A nonvolatile memory device according to an aspect of the present disclosure may include a substrate and a gate structure disposed on the substrate and including a hole pattern. The gate structure may include at least one gate electrode layer and at least one interlayer insulation layer which are alternately stacked, and the gate electrode layer may protrude toward a center of the hole pattern relative to the interlayer insulation layer. The nonvolatile memory device may include a first functional layer disposed inside the hole pattern along a sidewall surface of the gate structure, a second functional layer disposed on the first functional layer inside the hole pattern, and a channel layer extending in a direction perpendicular to the substrate inside the hole pattern and disposed to contact a cell portion of the second functional layer. The cell portion of the second functional layer may indirectly cover a sidewall surface of the gate electrode layer.

A nonvolatile memory device according to another aspect of the present disclosure may include a substrate and a gate structure disposed on the substrate. The gate structure may include at least one gate electrode pattern layer and at least one interlayer insulation layer which are alternately stacked along a first direction perpendicular to the substrate. The gate structure may extend in a second direction perpendicular to the first direction. The gate electrode pattern layer may protrude in a third direction perpendicular to the first and second directions relative to the interlayer insulation layer. The nonvolatile memory device may include a first functional layer disposed along a sidewall surface of the gate structure on the substrate, a second functional layer disposed on the first functional layer, and a channel layer extending in the first direction and disposed to contact a cell portion of the second functional layer on the substrate. The cell portion of the second functional layer may indirectly cover the sidewall surface of the gate electrode pattern layer.

DETAILED DESCRIPTION

Figure 1:
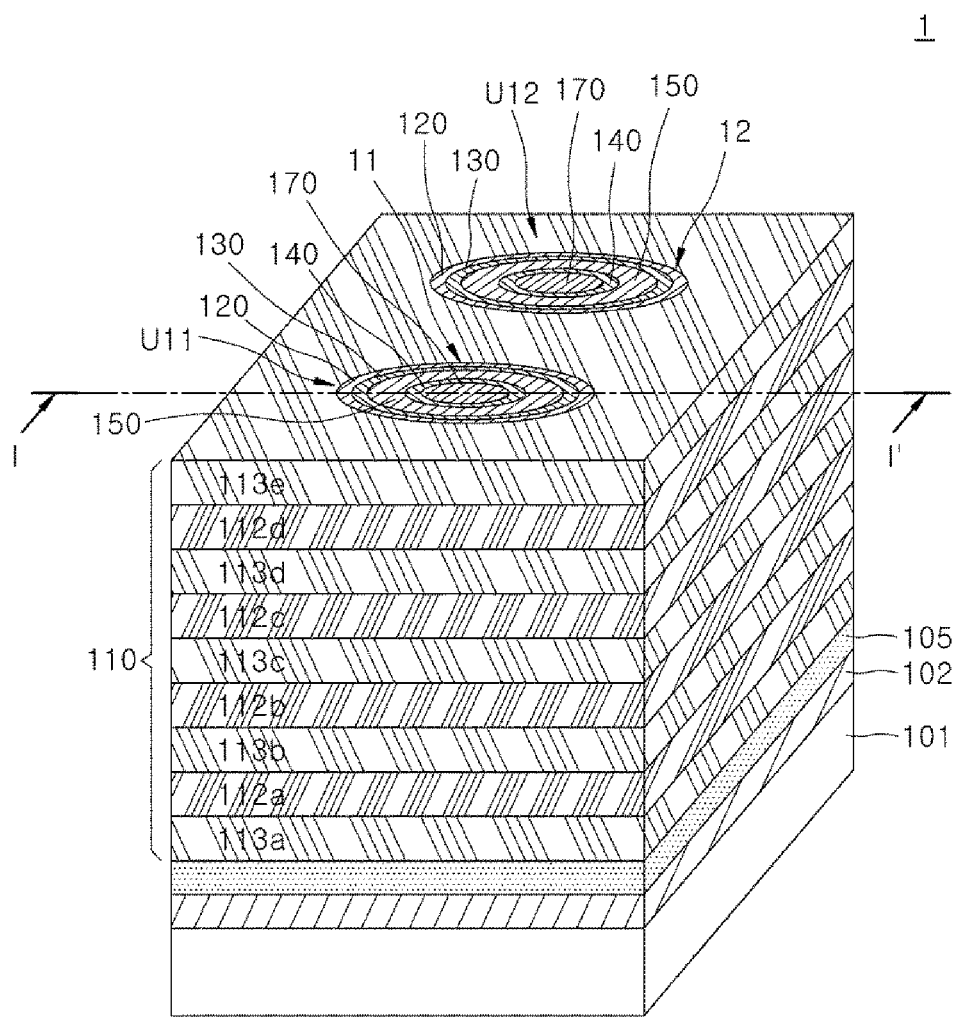
FIG. 1 is a perspective view schematically illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include" or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

In performing a method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Figure 2:
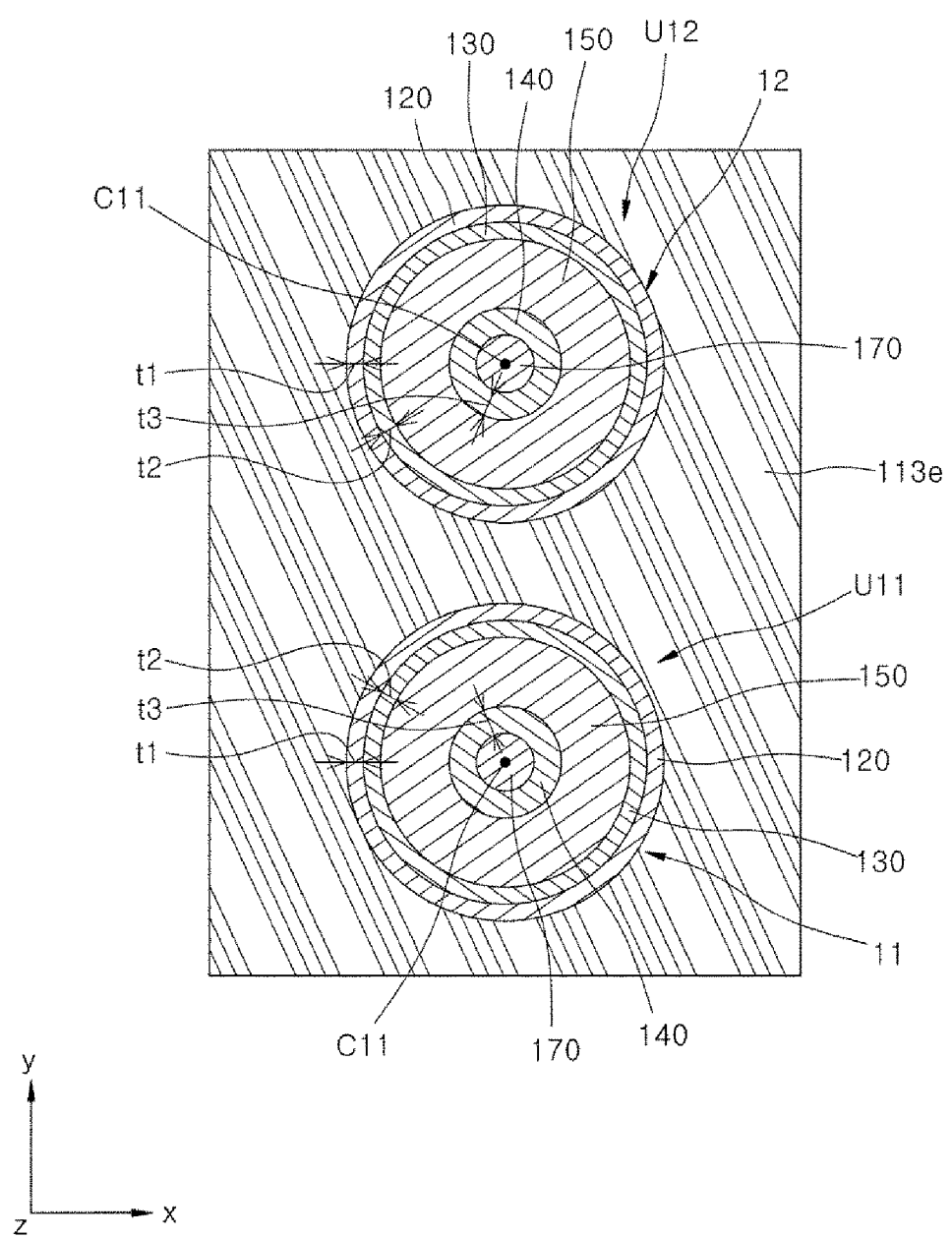
FIG. 2 is a plan view of the nonvolatile memory device of FIG. 1.
Figure 3:
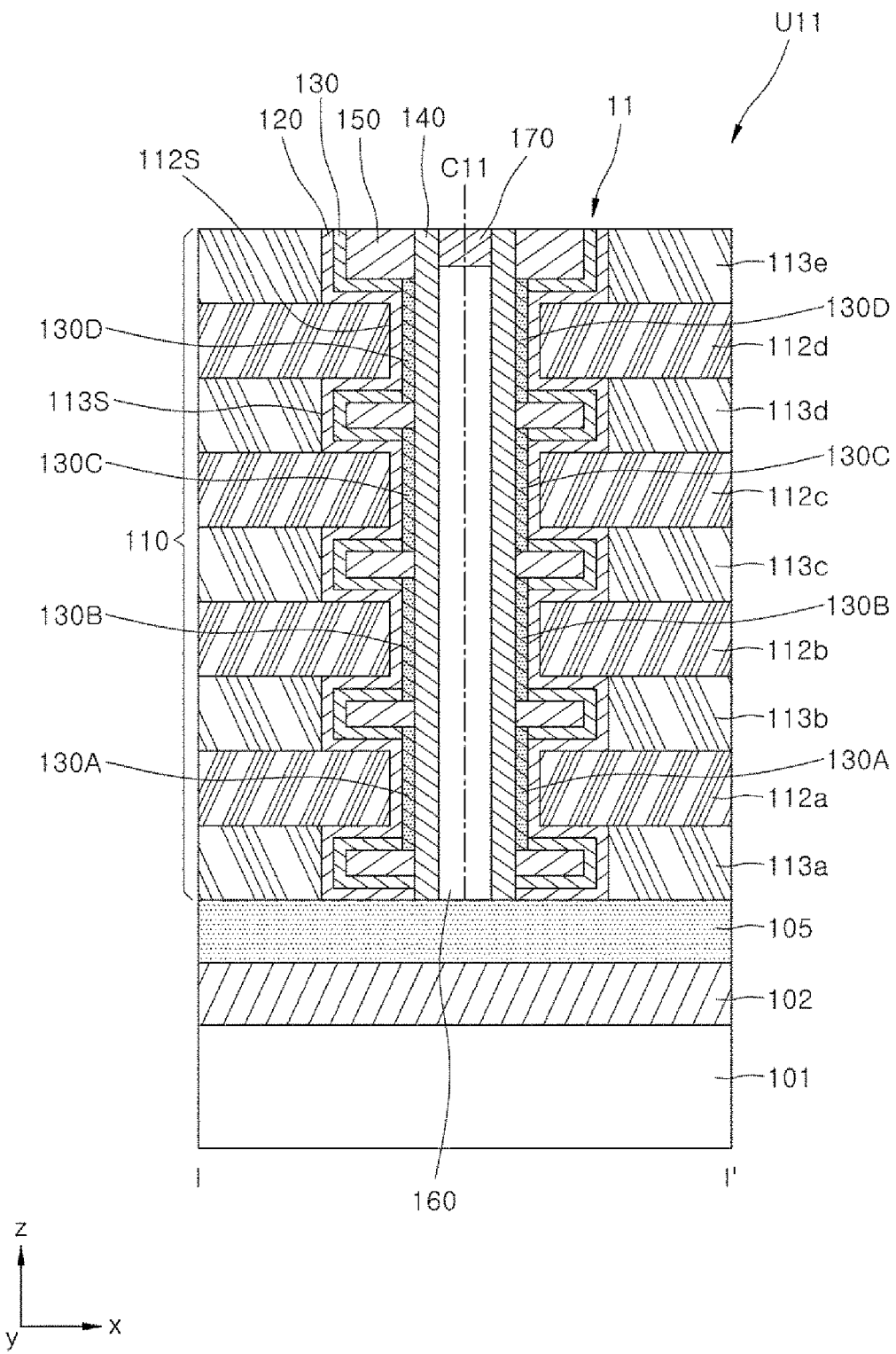
FIG. 3 is a cross-sectional view taken along a line I-I' of the nonvolatile memory device of FIG. 1.

FIG. 1 is a perspective view schematically illustrating a nonvolatile memory device according to an embodiment of the present disclosure. FIG. 2 is a plan view of the nonvolatile memory device of FIG. 1. FIG. 3 is a cross-sectional view taken along a line I-I' of the nonvolatile memory device of FIG. 1.

Referring to FIGS. 1 to 3, the nonvolatile memory device 1 may be a resistance change memory device. The nonvolatile memory device 1 may include a substrate 101, a gate structure 110 disposed on the substrate 101 and including hole patterns 11 and 12, first functional layers 120 disposed along a sidewall surface of the gate structure 110 in the hole patterns 11 and 12, and second functional layers 130 disposed on the first functional layer 120 in the hole patterns 11 and 12. In an embodiment, the gate structure 110 may include a plurality of hole patterns 11 and 12, and each of the plurality of hole patterns 11 and 12 may be spaced apart from each other. The nonvolatile memory device 1 may include first and second memory element units U11 and U12 that are distinguished from each other for hole patterns 11 and 12. The first and second memory element units U11 and U12 may be operated independently of each other.

The nonvolatile memory device 1 may include channel layers 140 extending in the z-direction on or over the substrate 101. The channel layers 140 may be disposed to contact first to fourth cell portions 130A, 130B, 130C and 130D of the second functional layers 130. The first to fourth cell portions 130A, 130B, 130C and 130D of the second functional layers 130 may indirectly cover the sidewall surfaces 112S of the corresponding first to fourth gate electrode layers 112a, 112b, 112c and 112d. That is, the first to fourth cell portions 130A, 130B, 130C and 130D of the second functional layers 130 may face the protruding sidewall surfaces 112S of the first to fourth electrode layers 112a, 112b, 112c and 112d, for example, where the first functional layer 120 is interposed therebetween. Referring to FIGS. 1 to 3, portions of the first functional layer 120 may be disposed to contact the sidewall surfaces 112S of the first to fourth electrode layers 112a, 112b, 112c and 112d, and likewise, the first to fourth cell portions 130A, 130B, 130C and 130D of the second functional layers 130 may be disposed to contact portions of the first functional layer 120 opposite from the sidewall surfaces 112S.

In addition, the nonvolatile memory device 1 may have gap filling layers 150 in regions adjacent to the channel layers 140. Each of the gap filling layers 150 may be disposed between the channel layer 140 and the second functional layer 130, for example, in a space between the channel layer 140 and a non-contact portion of the second functional layer 130. The non-contact portion is a non-cell portion of the second functional layer 130 which does not contact the channel layer 140.

The nonvolatile memory device 1 may further include a channel lower contact layer 105, contacting one end of the channel layer 140, disposed on or over the substrate 101. The channel lower contact layer 105 may be electrically connected to a source electrode (not illustrated). The nonvolatile memory device 1 may further include a channel upper contact layer 170 contacting the other end of the channel layer 140. The channel upper contact layer 170 may contact the other end of the channel layer 140 disposed in a direction (i.e., the z-direction) perpendicular to the substrate 101.

Referring to FIGS. 1 to 3, the substrate 101 may include a semiconductor material. Specifically, the semiconductor material may include silicon (Si), germanium (Ge), gallium arsenide (GaAs), and the like.

A base insulation layer 102 may be disposed on the substrate 101. The base insulation layer 102 may include an insulating material. The insulating material may, for example, include oxide, nitride, oxynitride, or a combination of two or more thereof.

Although not illustrated in FIG. 1, at least one conductive layer and at least one insulation layer may be disposed between the substrate 101 and the base insulation layer 102. The conductive layer and the insulation layer may form various circuit patterns. That is, the conductive layer and the insulation layer may form a plurality of wirings or may constitute passive elements such as capacitors or resistors, or active elements such as diodes or transistors. In an embodiment, the circuit patterns may constitute a driving circuit that drives the nonvolatile memory device 1.

The channel lower contact layer 105 may be disposed on the base insulation layer 102. The channel lower contact layer 105 may be electrically connected to the channel layer 140. Although not illustrated, the channel lower contact layer 105 may be electrically connected to a source electrode. The channel lower contact layer 105 may include a conductive material. The conductive material may, for example, include doped silicon (Si), metal, conductive metal nitride, conductive metal carbide, conductive metal silicide, or conductive metal oxide. The conductive material may, for example, include, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate structure 110 may be disposed on the channel lower contact layer 105. The gate structure 110 may include the first to fourth gate electrode layers 112a, 112b, 112c and 112d and first to fifth interlayer insulation layers 113a, 113b, 113c, 113d and 113e, which are alternately stacked along the first direction (i.e., the z-direction) perpendicular to the substrate 101. The first interlayer insulation layer 113a may be disposed to contact the channel lower contact layer 105. The fifth interlayer insulation layer 113e may be disposed as an uppermost layer of the gate structure 110.

The gate structure 110 may have the hole patterns 11 and 12. The hole patterns 11 and 12 may penetrate the gate structure 110 to expose the channel lower contact layer 105. In the plan view of FIG. 2, the hole patterns 11 and 12 may each have a circular shape as an example, but embodiments are not necessarily limited thereto, and each hole pattern may have an oval shape or a polygonal shape.

As illustrated in FIG. 3, the first to fourth gate electrode layers 112a, 112b, 112c and 112d may protrude toward the center C11 of the hole patterns 11 and 12, relative to the first to fifth interlayer insulation layers 113a, 113b, 113c, 113d and 113e. The center C11 of the hole patterns 11 and 12 may refer to the center point of each of the circular hole patterns 11 and 12 in the plan view of FIG. 2, and may refer to a central axis inside each of the hole patterns 11 and 12 passing through the center point of the hole patterns 11 and 12 and extending in a direction perpendicular to the substrate 101 in the cross-sectional view of FIG. 3.

Referring to FIG. 3, as the first to fourth gate electrode layers 112a, 112b, 112c and 112d protrude toward the center C11 of the hole patterns 11 and 12, the sidewall surface of the gate structure 110 within the hole patterns 11 and 12 may have an uneven or curved shape. As a result, each of the first functional layer 120 and the second functional layer 130 may be disposed to have an uneven, ribbed, corrugated or curved shape. In an embodiment, the first functional layer 120 may be disposed to have a predetermined thickness t1 along the curvature of the sidewall surface of the gate structure 110. The second functional layer 130 may be disposed to have a predetermined thickness t2 along the surface shape of the first functional layer 120.

In an embodiment, the first functional layer 120 may be a gate insulation layer. The first functional layer 120 may include an insulating material. The insulating material may, for example, include silicon oxide, silicon nitride, silicon oxynitride, aluminum oxide, hafnium oxide, and the like. The first functional layer 120 may serve to electrically insulate the first to fourth gate electrode layers 112a, 112b, 112c and 112d and the second functional layer 130 from each other.

In an embodiment, the second functional layer 130 may be a resistance change layer. The second functional layer 130 may include a variable resistance material. In the variable resistance material, an internal resistance state may be variably changed depending on the polarity or magnitude of an applied voltage. In addition, the changed internal resistance state may be stored in a non-volatile manner in the variable resistance material after the applied voltage is removed. As an example, a high resistance state and a low resistance state, which are distinguished from each other, may be selectively stored in the variable resistance material. In other words, the variable resistance material may have a predetermined first resistance value corresponding to the high resistance state, and may have a predetermined second resistance value corresponding to the low resistance state. The first resistance value and the second resistance value may be determined depending on the kind of the variable resistance material. In some embodiments, the number of differentiated high resistance states and low resistance states that can be distinguished from each other may be at least two or more.

In an embodiment, the variable resistance material may be a phase change material. Phase of the phase change material may be reversely changed between a crystalline state of low resistance and an amorphous state of high resistance. Even when the applied external voltage or current is removed, the phase change material may non-volatilely store the changed crystalline state or amorphous state. The phase change material may, for example, include a known chalcogenide-based material.

In another embodiment, the variable resistance material may be a compound material including movable oxygen vacancies or movable metal ions. As an example, oxygen vacancies may have positive charge, and metal ions may be cations having a positive charge or anions having a negative charge. The variable resistance material may, for example, include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In another example, the variable resistance material may include PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YB_{a2}Cu_3O_{7-x}$, $0<x<1$), (Ba, Sr)$TiO_3$ doped with chromium (Cr) or niobium (Nb), $SrZrO_3$ doped with chromium (Cr) or vanadium (V), (La, Sr) $MnO_3$, $Sr_{1-x}La_xTiO_3$ ($0<x<1$), $La_{1-x}Sr_xFeO_3$ ($0<x<1$), $La_{1-x}Sr_xCoO_3$ ($0<x<1$), $SrFeO_{2.7}$, $LaCoO_3$, $RuSr_2GdCu_2O_3$, $YB_{a2}Cu_3O_7$, or a combination of two or more thereof. As another example, the variable resistance material may include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $Ge_xSe_{1-x}$ ($0<x<1$), silver sulfide ($Ag_2S$), copper sulfide ($Cu_2S$), Cadmium sulfide (CdS), zinc sulfide (ZnS), and selenium oxide ($CeO_2$), or a combination of two or more thereof.

Referring to FIGS. 1 to 3 again, the channel layers 140 may be disposed inside the hole patterns 11 and 12. The channel layer 140 may be a band-shaped or straw-like structure extending in a direction (z-direction) perpendicular to the substrate 101 on the channel lower contact layer 105. In the plan view of FIG. 2, the channel layer 140 may have a predetermined thickness t3. The channel layer 140 may include a semiconductor material. The semiconductor material may include silicon (Si), germanium (Ge), and gallium arsenide (GaAs), etc., as an example. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide ($MoSe_2$), hafnium selenide ($HfSe_2$), indium selenide (InSe), gallium selenide (GaSe), and the like. The semiconductor material may include, for example, metal oxide such as indium-gallium-zinc oxide (IGZO).

The channel layer 140 may contact first to fourth cell portions 130A, 130B, 130C and 130D of the second functional layer 130 along a direction (z-direction) perpendicular to the substrate 101. The first to fourth cell portions 130A, 130B, 130C and 130D of the second functional layer 130 may be disposed to indirectly cover the sidewall surfaces 112S of the protruding first to fourth gate electrode layers 112a, 112b, 112c and 112d. That is, the first to fourth cell portions 130A, 130B, 130C and 130D of the second functional layer 130 may face the sidewall surfaces 112S of the first to fourth gate electrode layers 112a, 112b, 112c and 112d while the first functional layer 120 is interposed therebetween. The first to fourth cell portions 130A, 130B, 130C and 130D of the second functional layer 130 may be disposed on a plane parallel to the sidewall surfaces 112S of the protruding first to fourth gate electrode layers 112a, 112b, 112c and 112d.

As will be described later, in the first to fourth cell portions 130A, 130B, 130C and 130D of the second functional layer 130, conductive paths may be generated under the control of the corresponding first to fourth gate electrode layers 112a, 112b, 112c and 112d. When the variable resistance material includes, for example, the movable oxygen vacancies or movable metal ions, the conductive path may be a conductive filament formed to pass through the inside of the variable resistance material. As another example, when the variable resistance material is a phase change material, the phase change material may be converted from an amorphous high resistance body into a crystalline low resistance body, and then conductive paths may be formed by passing through the low resistance body.

Meanwhile, the gap filling layers 150 may be disposed in spaces between the channel layers 140 and non-contact portions (i.e., non-cell portions) of the second functional layers 130, which do not contact the channel layers 140. The gap filling layer 150 may each be disposed to fill a space between a portion of the second functional layer 130 disposed on or common to the sidewall surfaces 113S of the first to fifth interlayer insulation layers 113a, 113b, 113c, 113d and 113e and the channel layer 140. The gap filling layer 150 may each fill a space resulting from the interlayer insulation layers 113a, 113b, 113c, 113c and 113e recessed in the x-direction between gate electrode layers 112a, 112b, 112c and 112d that are adjacent to each other in the z-direction.

The gap filling layer 150 may include an insulating material. The insulating material may, for example, include oxide, nitride, oxynitride or a combination of two or more thereof.

Referring to FIG. 3 again, a core insulation structure 160 may be disposed inside each of the hole patterns 11 and 12 in which the first and second functional layers 120 and 130, the channel layer 140, and the gap filling layer 150 are disposed. In an embodiment, when each of the channel layers 140 is a band-shaped structure, the core insulation structure 160 may be disposed inside the structure.

In each of the hole patterns 11 and 12, a channel upper contact layer 170 may be disposed over the core insulation layer 160. The channel upper contact layer 170 may be electrically connected to the channel layer 140. Although not illustrated, the channel upper contact layer 170 may be electrically connected to a drain electrode. The channel upper contact layer 170 may include a conductive material. The conductive material may, for example, include a doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In FIG. 3, the channel upper contact layer 170 is disposed inside each of the hole patterns 11 and 12, but its placement is not limited thereto. The channel upper contact layer 170 may be disposed outside each of the hole patterns 11 and 12. As an example, the channel upper contact layer 170 may be disposed on the channel layer 140 and may be electrically connected to the channel layer 140.

As described above, the nonvolatile memory device 1 according to an embodiment of the present disclosure may have the first to fourth gate electrode layers 112a, 112b, 112c and 112d protruding toward the center C11 of each of the hole patterns 11 and 12 compared to the first to fifth interlayer insulation layers 113a, 113b, 113c, 113d and 113e. Accordingly, when the first and second functional layers 120 and 130 are disposed to sequentially cover the sidewall surfaces 112S of the protruding first to fourth gate electrode layers 112a, 112b, 112c and 112d and sidewall surfaces 113S of the first to fifth interlayer insulation layers 113a, 113b, 113c, 113d and 113e, the channel layers 140 may be disposed to contact the first to fourth cell portions 130A, 130B, 130C and 130D of the second functional layer 130. The remaining portions of the second functional layer 130 except for the first to fourth cell portions 130A, 130B, 130C and 130D may be disposed not to contact the channel layer 140. Accordingly, as described later, when operating the nonvolatile memory device 1, signal interference between the first to fourth cell portions 130A, 130B, 130C and 130D neighboring along the z-direction can be effectively excluded. Hereinafter, an operation method of a nonvolatile memory device will be described with reference to FIGS. 4 to 6, 7A, 7B, 8A, and 8B.

Figure 4:
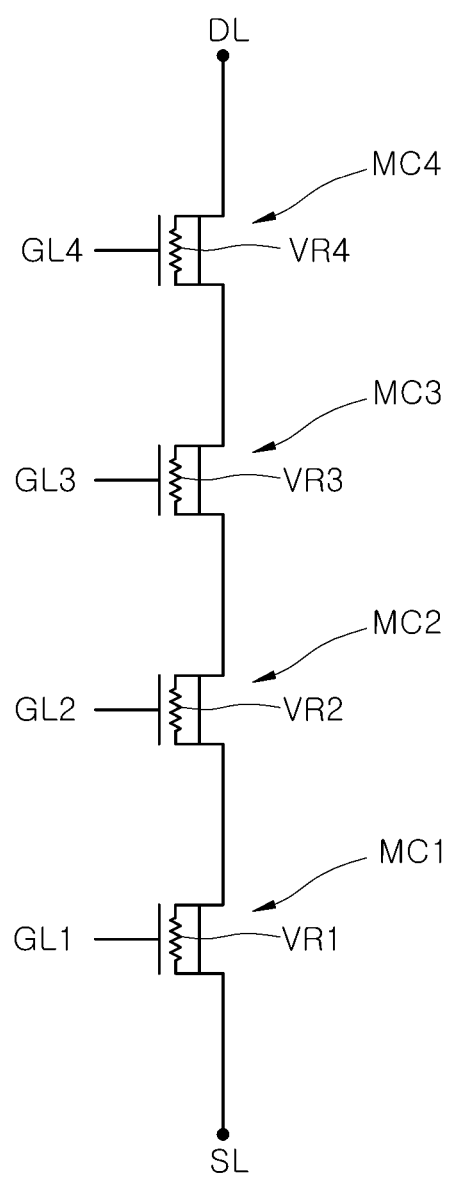
FIG. 4 is a circuit diagram of a nonvolatile memory device according to an embodiment of the present disclosure.

FIG. 4 is a circuit diagram of a nonvolatile memory device according to an embodiment of the present disclosure. In a specific embodiment, FIG. 4 is a circuit diagram of a first memory element unit U11 constituted by the first functional layer 120, the second functional layer 130, the channel layer 140, and the first to fourth gate electrode layers 112a, 112b, 112c and 112d inside one hole pattern 11 in the nonvolatile memory device 1 described above with reference to FIGS. 1 to 3. The first memory element unit U11 may include transistor-type first to fourth memory cells MC1, MC2, MC3 and MC4. Although not illustrated, the circuit diagram of a second memory element unit U12 constituted by the first functional layer 120, the second functional layer 130, the channel layer 140, and the first to fourth gate electrode layers 112a, 112b, 112c and 112d inside the other hole pattern 12 of FIGS. 1 to 3 may be substantially the same as the circuit diagram of the first memory element unit U11. The first functional layer 120 may function as a gate insulation layer of the transistor, and the second functional layer 130 may function as a resistance change layer including a variable resistance material.

Referring to FIG. 4, the first to fourth memory cells MC1, MC2, MC3 and MC4 may be connected in series to each other in a string form between a source electrode SL and a drain electrode DL. The first to fourth memory cells MC1, MC2, MC3 and MC4 may each include a transistor-type nonvolatile memory element. The first to fourth memory cells MC1, MC2, MC3 and MC4 may have first to fourth resistive element layer VR1, VR2, VR3 and VR4, respectively, disposed between the gate insulation layers of the transistors and conductive channels.

Referring to FIGS. 1 to 3 again, the channel lower contact layer 105 and the channel upper contact layer 170 may be electrically connected to a source electrode (not illustrated) and a drain electrode (not illustrated), respectively. Here, the source electrode and the drain electrode may correspond to the source electrode SL and the drain electrode DL of FIG. 4, respectively. The first to fourth gate electrode layers 112a, 112b, 112c and 112d of FIGS. 1 to 3 may correspond to the first to fourth gate electrodes GL1, GL2, GL3 and GL4 of FIG. 4, respectively. The first to fourth cell portions 130A, 130B, 130C and 130D of the second functional layer 130 controlled by the first to fourth gate electrode layers 112a, 112b, 112c and 112d of FIGS. 1 to 3, respectively, may correspond to the first to fourth resistive element layers VR1, VR2, VR3 and VR4, respectively.

Figure 5:
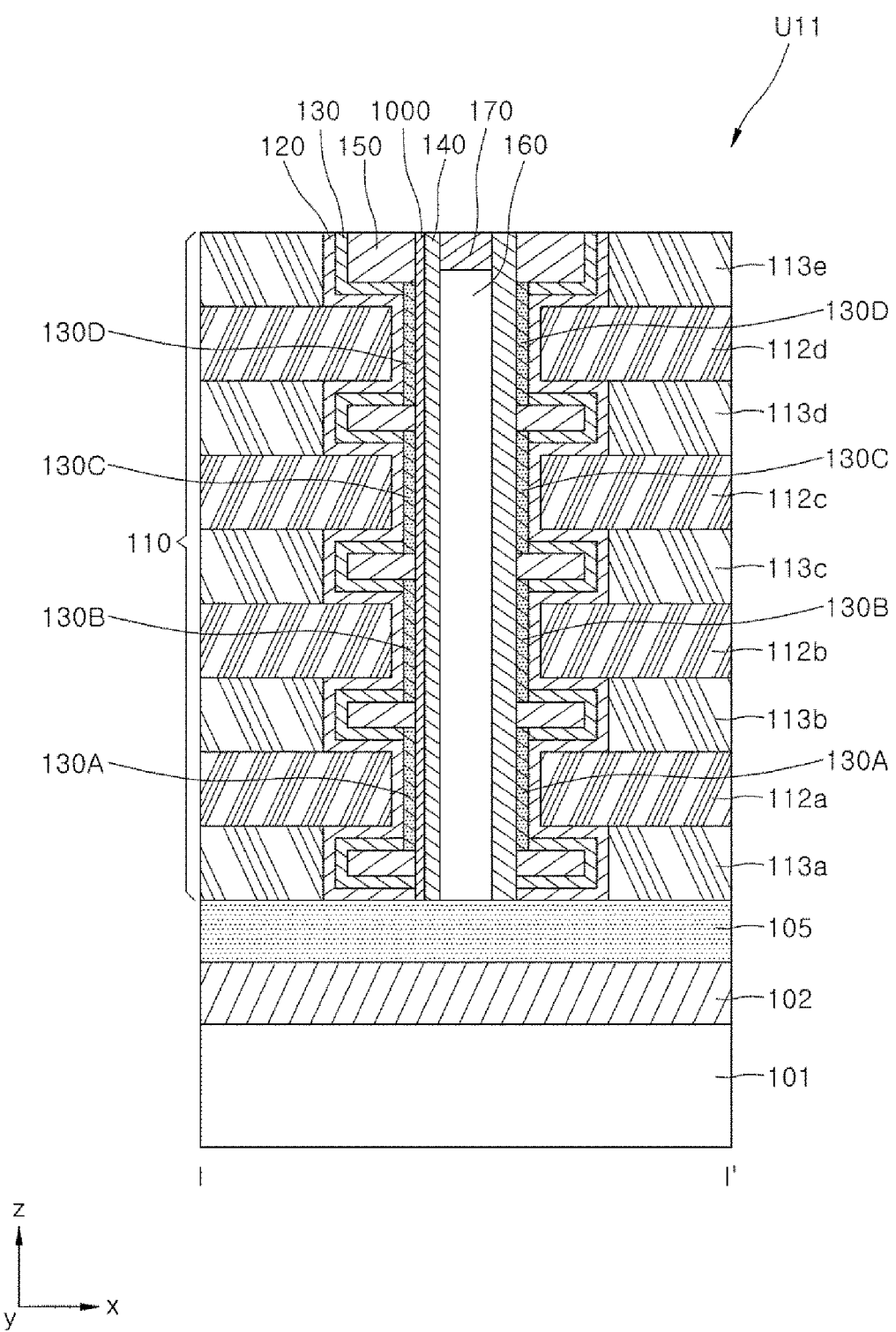
FIGS. 5, 6, 7A, 7B, 8A and 8B are views schematically illustrating operations of a nonvolatile memory device according to an embodiment of the present disclosure.
Figure 6:
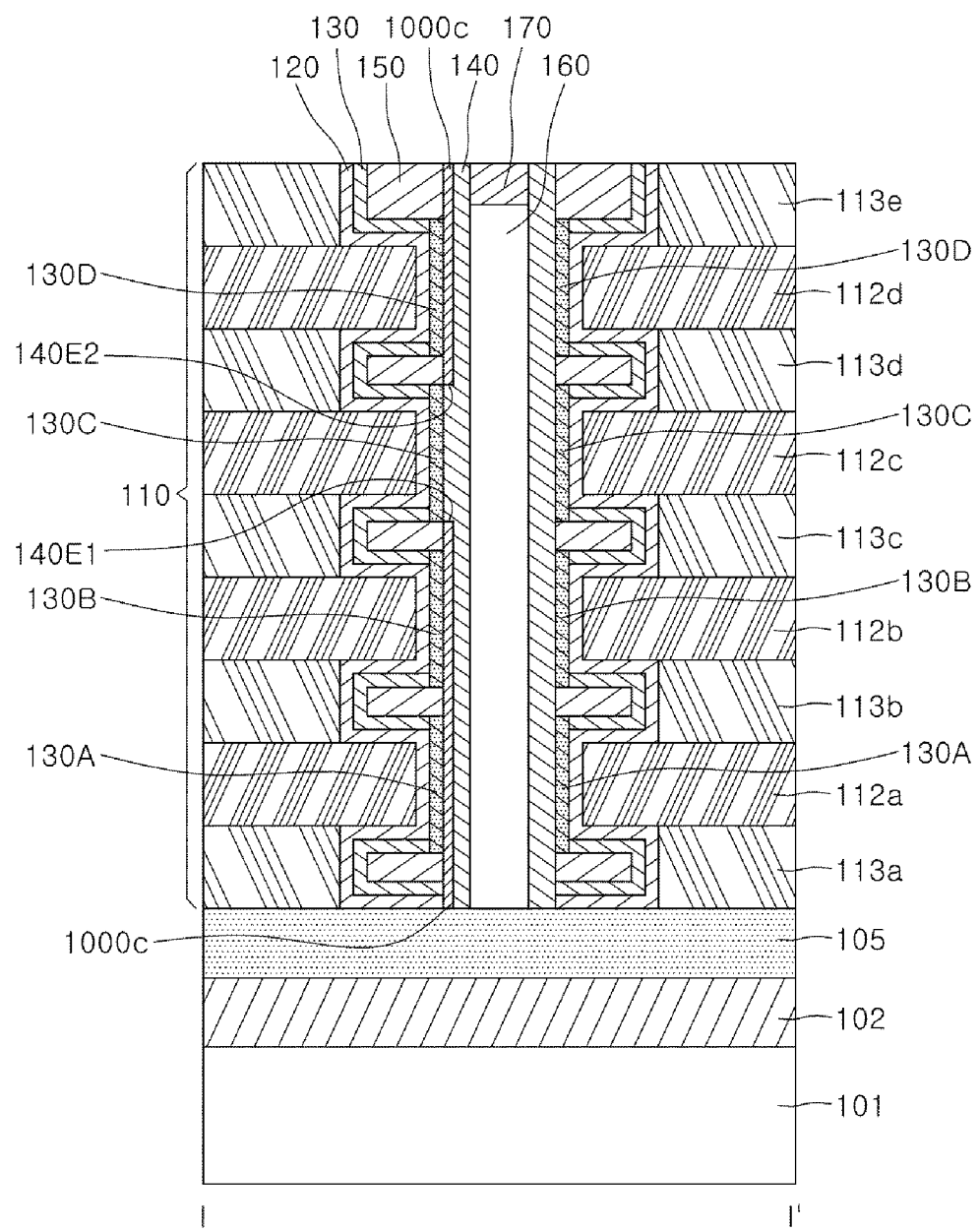
Figure 7A:
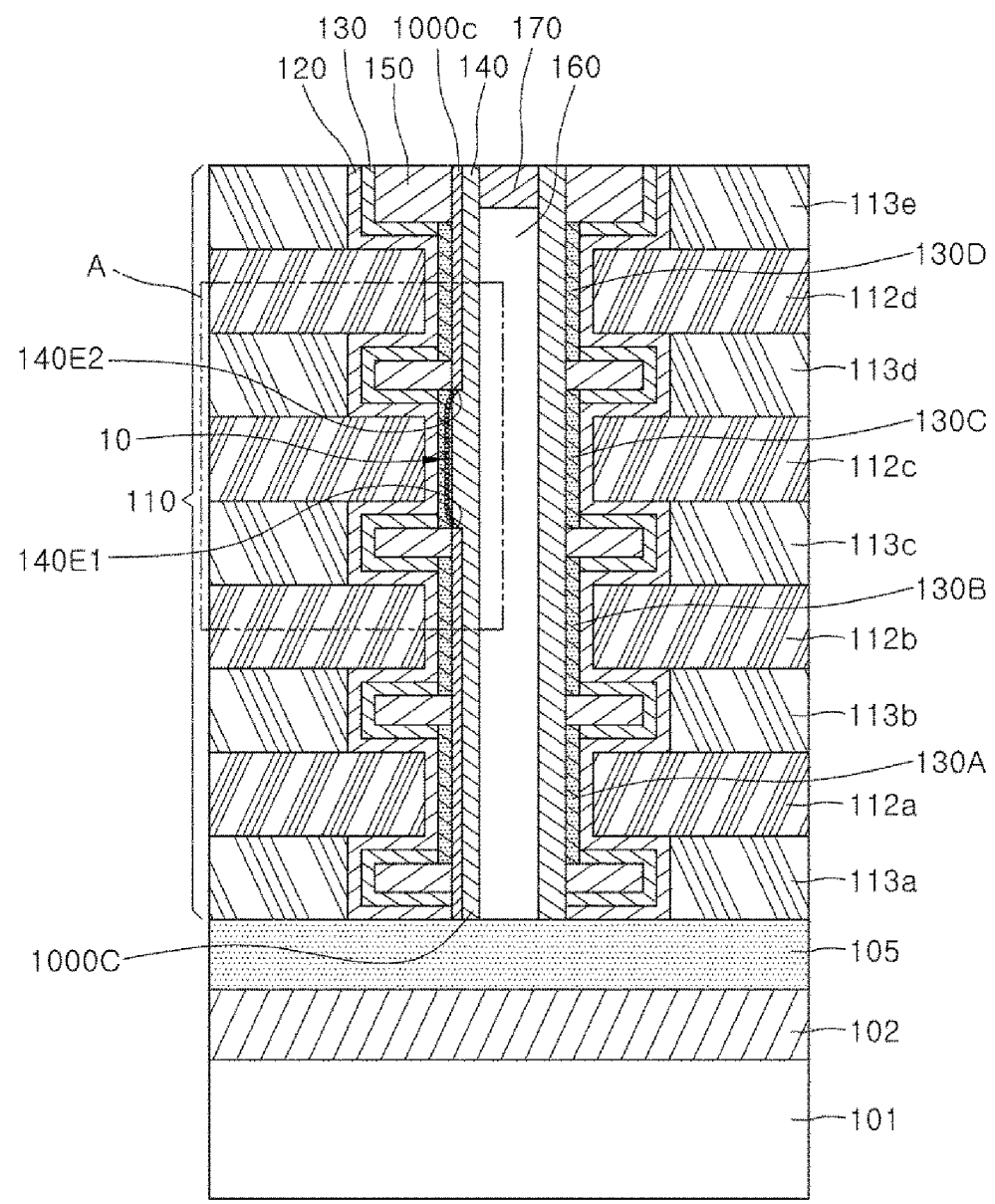
Figure 7B:
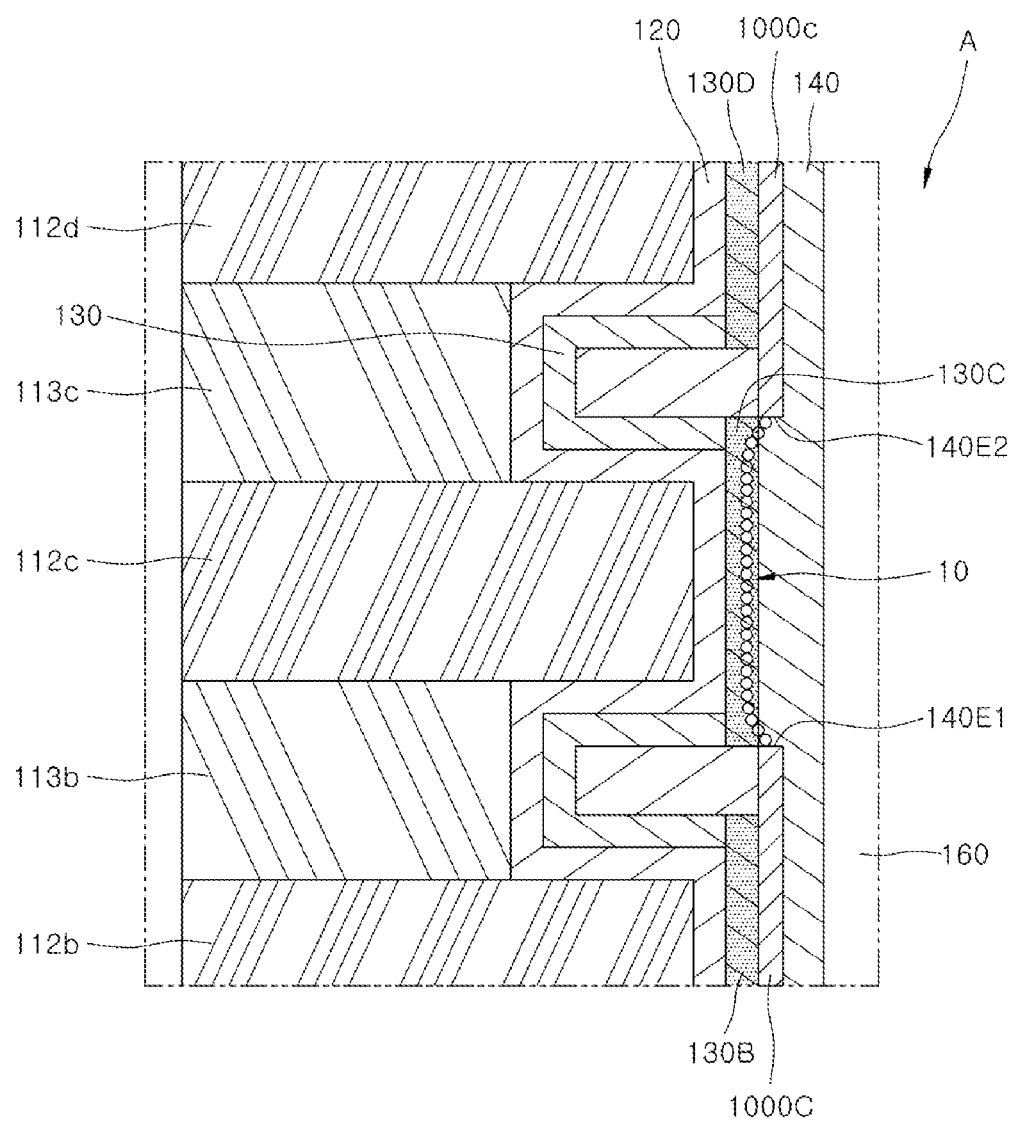
Figure 8A:
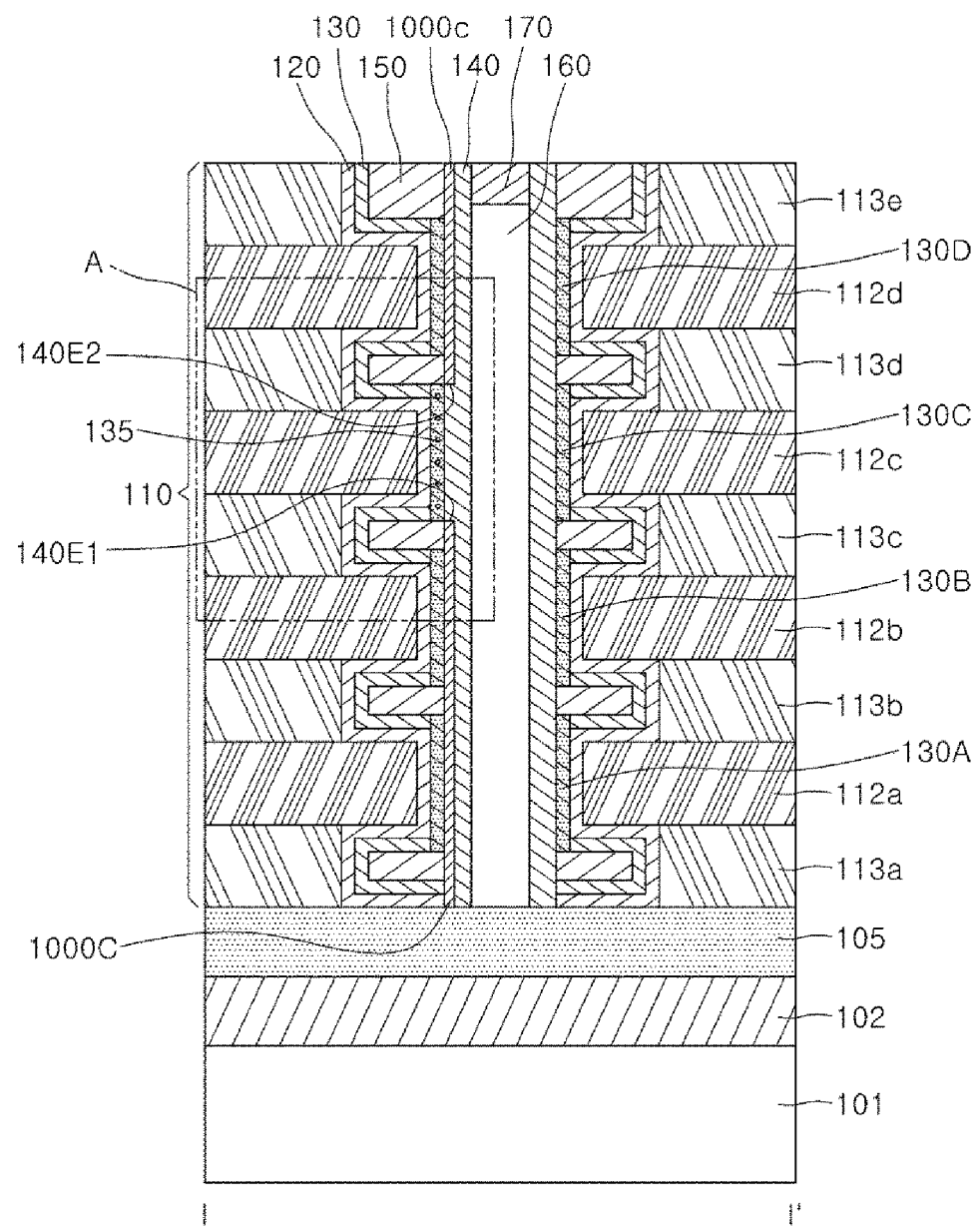
Figure 8B:
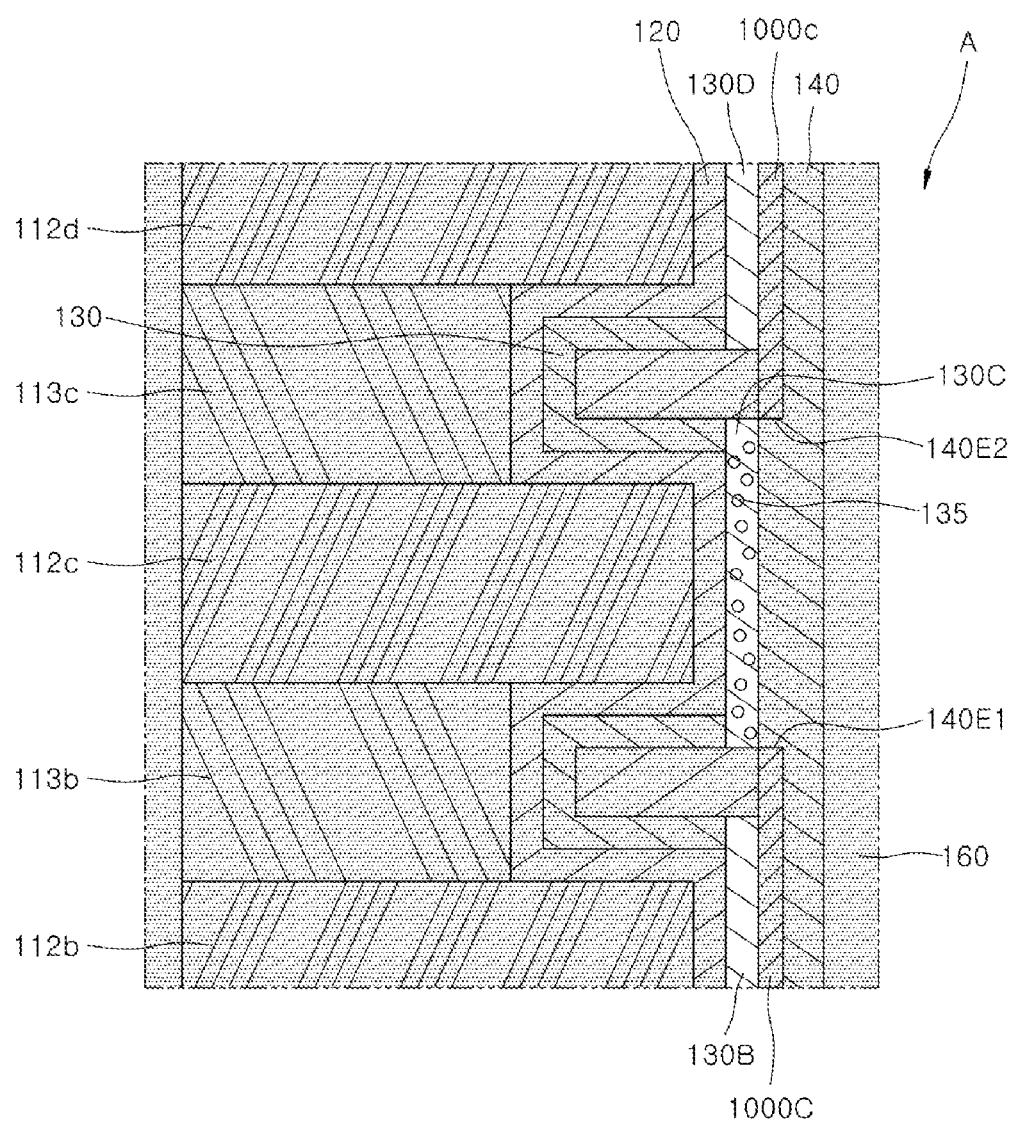

FIGS. 5, 6, 7A, 7B, 8A and 8B are views schematically illustrating operations of a nonvolatile memory device according to an embodiment of the present disclosure. FIGS. 7B and 8B are enlarged views of area 'A' of FIGS. 7A and 8A. Specifically, FIGS. 5, 6, 7A and 7B are views explaining a set operation of a nonvolatile memory device according to an embodiment of the present disclosure, and FIGS. 5, 6, 8A and 8B are views explaining a reset operation of the nonvolatile memory device. Hereinafter, an operation method of the nonvolatile memory device according to an embodiment will be described using the first memory element unit U11 of the nonvolatile memory device 1 described above with reference to FIGS. 1 to 3 and the circuit diagram of the nonvolatile memory device 1 described above with reference to FIG. 4. For convenience of description, the set operation and the reset operation will be described, for example, using the third memory cell MC3 having the third resistive element layer VR3 of the circuit diagram of FIG. 4. The third resistive element layer VR3 may correspond to the third cell portion 130C of the second functional layer 130 controlled by the third gate electrode layer 112c of FIGS. 1 to 3. Further, as an example, the second functional layer 130 may have a variable resistance material having movable oxygen vacancies.

The nonvolatile memory device 1 can store different signal information depending on the resistance states of the first to fourth cell portions 130A, 130B, 130C and 130D of the second functional layer 130, which is a resistance change layer. As an example, the first to fourth cell portions 130A, 130B, 130C and 130D of the second functional layer 130 may each have one of a low resistance state and a high resistance state that are distinguished from each other. A write operation that causes each of the first to fourth cell portions 130A, 130B, 130C and 130D of the second functional layer 130 to have a low resistance state can be referred to as the set operation. A write operation that causes each of the first to fourth cell portions 130A, 130B, 130C and 130D of the second functional layer 130 to have a high resistance state can be referred to as the reset operation.

Referring to FIG. 5, for the set operation, a predetermined first gate voltage including a bias having a positive polarity may be applied to the first to fourth gate electrode layers 112a, 112b, 112c and 112d. A conductive channel 1000 may be formed in the channel layer 140 by the first gate voltage. An electric field generated by the first gate voltage may also act on the regions of the channel layer 140 that do not overlap the first to fourth gate electrode layers 112a, 112b, 112c and 112d in the x-direction, as well as on the regions of the channel layer 140 that do overlap the first to fourth gate electrode layers 112a, 112b, 112c and 112d in the x-direction. In the regions of the channel layer 140 that do not overlap the first to fourth gate electrode layers 112a, 112b, 112c and 112d in the x-direction, the electric field formed by the neighboring gate electrode layers may extend in the z-direction. As a result, the conductive channel 1000 may be formed in the regions of the channel layer 140 that do not overlap the first to fourth gate electrode layers 112a, 112b, 112c and 112d in the x-direction. Consequently, the conductive channel 1000 may be continuously formed in the entire channel layer 140 along the z-direction. In addition, the movable oxygen vacancies in the second functional layer 130 may move to a region adjacent to the channel layer 140 by a repulsive force generated by the first gate voltage. The oxygen vacancies that move to the region adjacent to the channel layer 140 may allow a conductive filament 10 to be more effectively formed when a set voltage described below is applied as shown in FIG. 7A.

Referring to FIG. 6, while the first gate voltage applied to the first gate electrode layer 112a, the second gate electrode layer 112b, and the fourth gate electrode layer 112d may be maintained, the first gate voltage applied to the third gate electrode layer 112c may be removed. Accordingly, the voltage applied to a portion of the conductive channel 1000 controlled by the third gate electrode layer 112c may be removed, and the conductive channel 1000 may be disconnected. The conductive channel 1000 may be converted into a disconnected conductive channel 1000c, and may be electrically insulated between both ends 140E1 and 140E2 of the disconnected conductive channel 1000c.

Referring to FIGS. 7A and 7B, as the first gate voltage is applied to the first gate electrode layer 112a, the second gate electrode layer 112b, and the fourth gate electrode layer 112d and the first gate voltage is removed from the third gate electrode layer 112c, a set voltage may be applied between the channel lower contact layer 105 and the channel upper contact layer 170. At this time, the set voltage may be concentrated on both ends 140E1 and 140E2 of the disconnected conductive channel 1000c.

A set operation electric field formed by the set voltage may be applied to the third cell portion 130C of the second functional layer 130 positioned between the both ends 140E1 and 140E2 of the disconnected conductive channel 1000c. More specifically, the set operation electric field may act on the third cell portion 130C of the second functional layer 130. Under the set operation electric field, the movable oxygen vacancies inside the third cell portion 130C may be aggregated or combined to form a conductive filament 10 in the third cell portion 130C. The conductive filament 10 may connect the ends 140E1 and 140E2 of the disconnected conductive channel 1000c. Even after the first gate voltage applied to the first gate electrode layer 112a, the second gate electrode layer 112b and the fourth gate electrode layer 112d and the set voltage applied between the channel lower contact layer 105 and the channel upper contact layer 170 are removed, the conductive filament 10 can remain in place in the third cell portion 130C. Accordingly, the third cell portion 130C of the second functional layer 130 controlled by the third gate electrode layer 112c can maintain a low resistance state through the conductive filament 10. As a result, through the above-described set operation, the third memory cell MC3 can store signal information of a low resistance state in a nonvolatile manner.

Next, the reset operation for the third memory cell MC3 will be described. As described in connection with FIG. 5, the first gate voltage may be applied to the first to fourth gate electrode layers 112a, 112b, 112c and 112d to form the conductive channel 1000 in the first channel layer 140.

Subsequently, as described above in connection with FIG. 6, while the first gate voltage applied to the first gate electrode layer 112a, the second gate electrode layer 112b and the fourth gate electrode layer 112d may be maintained, the first gate voltage applied to the third gate electrode layer 112c may be removed. Accordingly, the voltage applied to a portion of the conductive channel 1000 controlled by the third gate electrode layer 112c may be removed, and the conductive channel may be disconnected. The conductive channel 1000 may be converted into a disconnected conductive channel 1000c and the both ends 140E1 and 140E2 of the disconnected conductive channel 1000c may be electrically insulated from each other.

Next, as illustrated in FIGS. 8A and 8B, while applying the first gate voltage to the first gate electrode layer 112a, the second gate electrode layer 112b and the fourth gate electrode layer 112d, a predetermined second gate voltage may be applied to the third gate electrode layer 112c. The second gate voltage may have a polarity opposite to the first gate voltage. In addition, a reset voltage may be applied between the channel lower contact layer 105 and the channel upper contact layer 170. The reset voltage may have a polarity opposite to the set voltage.

If a conductive filament 10 connecting the ends 140E1 and 140E2 of the disconnected conductive channel 1000c already exists in the channel layer 140, then the conductive filament 10 may be decomposed and oxygen vacancies 135 may be discharged from the conductive filament 10 when the second gate voltage and the reset voltage are applied. The discharged oxygen vacancies 135 may move toward the third gate electrode layer 112c by an attraction force produced by the second gate voltage. Accordingly, the ends 140E1 and 140E2 of the disconnected conductive channel 1000c may be electrically insulated from each other again. Even after the first gate voltage, the second gate voltage, and the reset voltage are removed, the conductive filament 10 may exist in a decomposed state in the third cell portion 130C, or the conductive filament 10 may be effectively eliminated. Accordingly, the third cell portion 130C of the second functional layer 130 controlled by the third gate electrode layer 112c can maintain a high resistance state. As a result, through the above-described reset operation, the third memory cell MC3 can store the signal information of the high resistance state in a non-volatile manner.

Meanwhile, a read operation for the third memory cell MC3 may proceed as follows. The first gate voltage may be applied to the first gate electrode layer 112a, the second gate electrode layer 112b and the fourth gate electrode layer 112d, and a voltage might not be applied to the third gate electrode layer 112c. Accordingly, as illustrated in FIG. 6, a conductive channel 1000c disconnected at ends 140E1 and 140E2 may be formed in the channel layer 140.

Next, a read voltage may be applied between the channel lower contact layer 105 and the channel upper contact layer 170. The read voltage may be lower than the set voltage and the reset voltage. In a state in which the first gate voltage and the read voltage are applied, a current flowing between the channel lower contact layer 105 and the channel upper contact layer 170 may be measured. A difference in the magnitude of the measured current may be detected between cases in which a conductive filament 10 is present or in a continuously connected state in the third cell portion 130C of the third memory cell MC3 and cases where the conductive filament 10 is not present or in a disconnected state in the third cell portion 130C of the third memory cell MC3. The presence or absence of the conductive filament 10 in the third cell portion 130C can be determined using the magnitude difference of the measured current. As a result, signal information in a resistance state stored in the third cell portion 130C can be read.

The above-described set operation, reset operation, and read operation for the third memory cell MC3 in the first memory element unit U11 of the nonvolatile memory device 1 can be applied to the first memory cell MC1, second memory cell MC2 and fourth memory cell MC4 in substantially the same way. In addition, the set operation, reset operation, and read operation for the third memory cell MC3 can be applied to a set operation, reset operation, and read operation for the memory cells in the second memory element unit U12 of the nonvolatile memory device 1 in substantially the same way.

Meanwhile, although FIGS. 5, 6, 7A, 7B, 8A, and 8B illustrate a set operation, reset operation, and read operation when the second functional layer 130 includes a variable resistance material having movable oxygen vacancies as an example, it is not necessarily limited thereto. When the second functional layer 130 includes a variable resistance material having movable metal cations or metal anions, substantially the same set operation, reset operation, and read operation can be performed. In addition, when the second functional layer 130 includes a variable resistance material including a phase change material, instead of generating the conductive filament in the cell portion of the memory cell, the cell portion of the memory cell can be reversibly switched between an amorphous high-resistance body and a crystalline low-resistance body by the set voltage and the reset voltage applied between both ends of the disconnected conductive channel. As a result, the set operation and the reset operation can be performed. In addition, the read operation for reading out the crystal state or amorphous state of the cell portion of the memory cell can be performed.

Figure 9A:
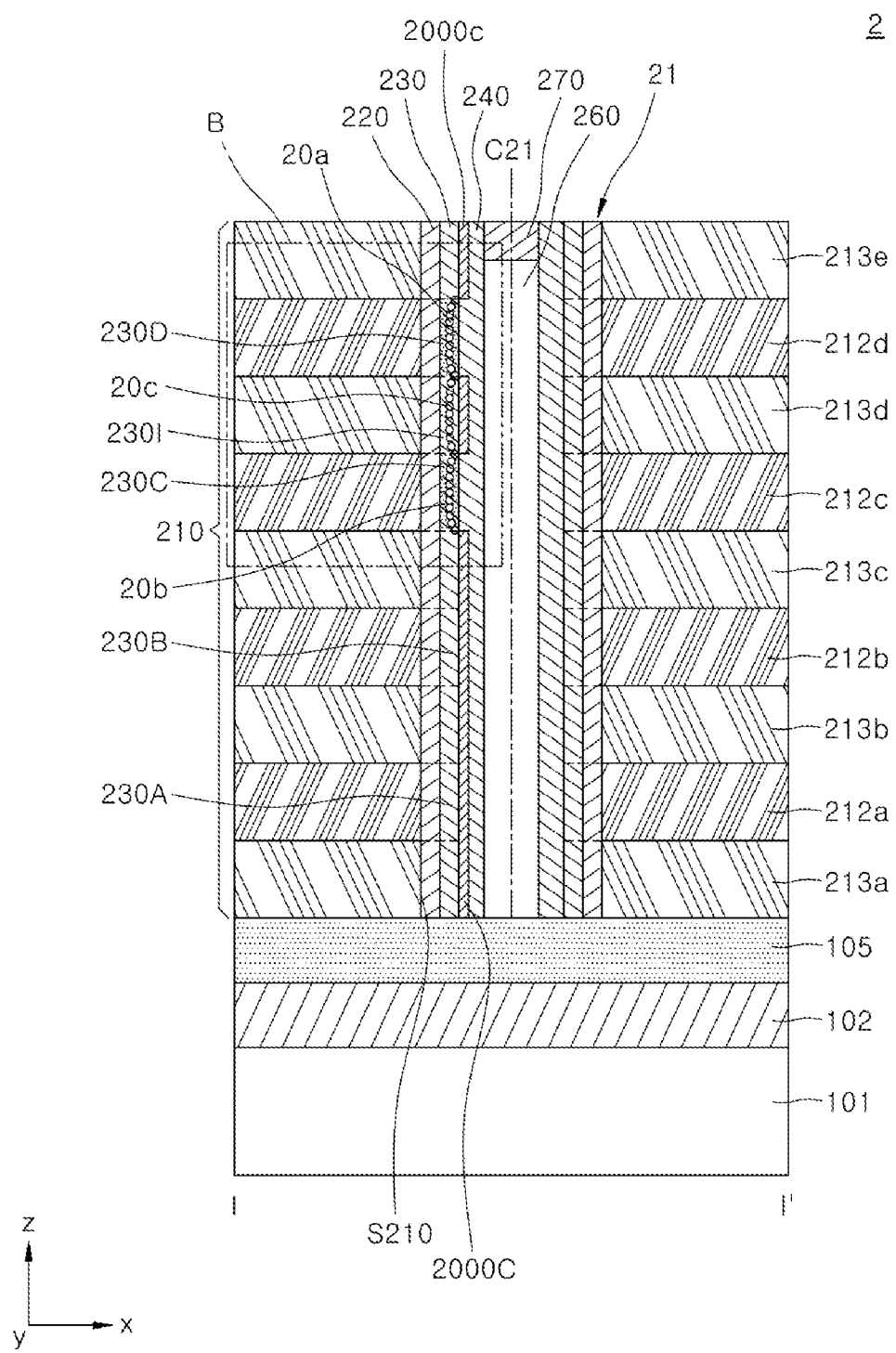
FIG. 9A is a cross-sectional view illustrating a nonvolatile memory device according to a comparative example.
Figure 9B:
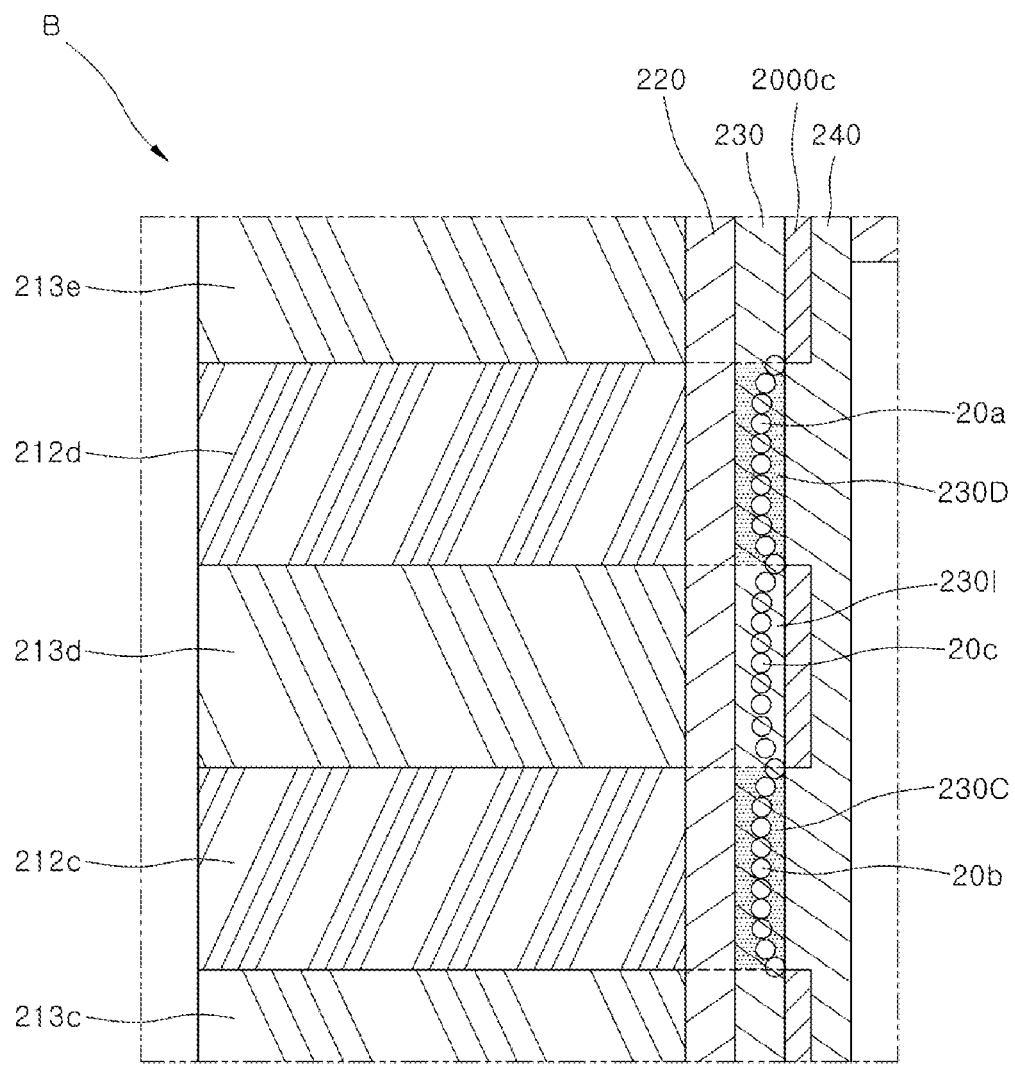
FIG. 9B is an enlarged view of area 'B' of FIG. 9A.

FIG. 9A is a cross-sectional view illustrating a nonvolatile memory device according to a comparative example. FIG. 9B is an enlarged view of area 'B' of FIG. 9A. Referring to FIGS. 9A and 9B, the nonvolatile memory device 2 according to the comparative example may be different from the nonvolatile memory device 1 described above with reference to FIGS. 1 to 3 with respect to the shapes of the side surfaces of a gate structure 210, a first functional layer 220 and a second functional layer 230 within a hole pattern. The rest of the configuration except for the shapes of the side surfaces may be substantially the same as the configuration of the nonvolatile memory device 1 described above with reference to FIGS. 1 to 3.

Referring to FIGS. 9A and 9B, the nonvolatile memory device 2 includes the gate structure 210 that is disposed on a lower channel contact layer 105 and has a hole pattern 21. The gate structure 210 includes first to fourth gate electrode layers 212a, 212b, 212c and 212d and first to fifth interlayer insulation layers 213a, 213b, 213c, 213d and 213e, which are alternately stacked. Compared with embodiments of the present disclosure, the first to fourth gate electrode layers 212a, 212b, 212c and 212d do not protrude in the x-direction, that is, toward the center C21 of the hole pattern 21. Accordingly, the sidewall surface S210 of the gate structure 210 may be substantially continuous in the z-direction to have a substantially uniform cross-section.

Accordingly, the first functional layer 220 and the second functional layer 230 may be disposed on the sidewall surface S210 of the gate structure 210 such that the channel layer 240 may be disposed to contact the entirety of the second functional layer 230 along the z-direction.

Referring to FIGS. 9A and 9B again, the second functional layer 230 may include first to fourth cell portions 230A, 230B, 230C and 230D which are controlled by the first to fourth gate electrode layers 212a, 212b, 212c and 212d, respectively. The first to fourth cell portions 230A, 230B, 230C and 230D may be portions of the second functional layer 230 that overlap with the first to fourth gate electrode layers 212a, 212b, 212c and 212d in the x-direction, respectively.

FIGS. 9A and 9B schematically illustrate errors which may occur during the set operation of the nonvolatile memory device of the comparative example. When conductive filaments 20a and 20b are formed in the fourth cell portion 230D and in the third cell portion 230C, which are adjacent to each other, there is a possibility that a parasitic filament 20c is generated in a non-cell portion 2301 of the second functional layer 230, positioned between the third cell portion 230C and the fourth cell portion 230D. As the degree of device integration increases, the thicknesses of the first to fifth interlayer insulation layers 213a, 213b, 213c, 213d and 213e decrease. Accordingly, a cell operation electric field acting on the third cell portion 230C and the fourth cell portion 230D will affect the non-cell portion 2301, and thus, there is a possibility that the parasitic filament 20c is formed. The parasitic filament 20c may act as a path for a leakage current, thereby reducing the reliability of signal information stored in adjacent third cell portion 230C and fourth cell portion 230D.

In contrast, in a nonvolatile memory device according to an embodiment of the present disclosure, as described above, a plurality of cell portions of the second functional layer, which is the resistance change layer, can be isolated from each other in the z-direction. Accordingly, it is possible to avoid formation of parasitic filaments in non-cell portions positioned between the plurality of cell portions of the second functional layer. As a result, the reliability of signal information stored in the plurality of cell portions of the second functional layer can be improved.

Figure 10:
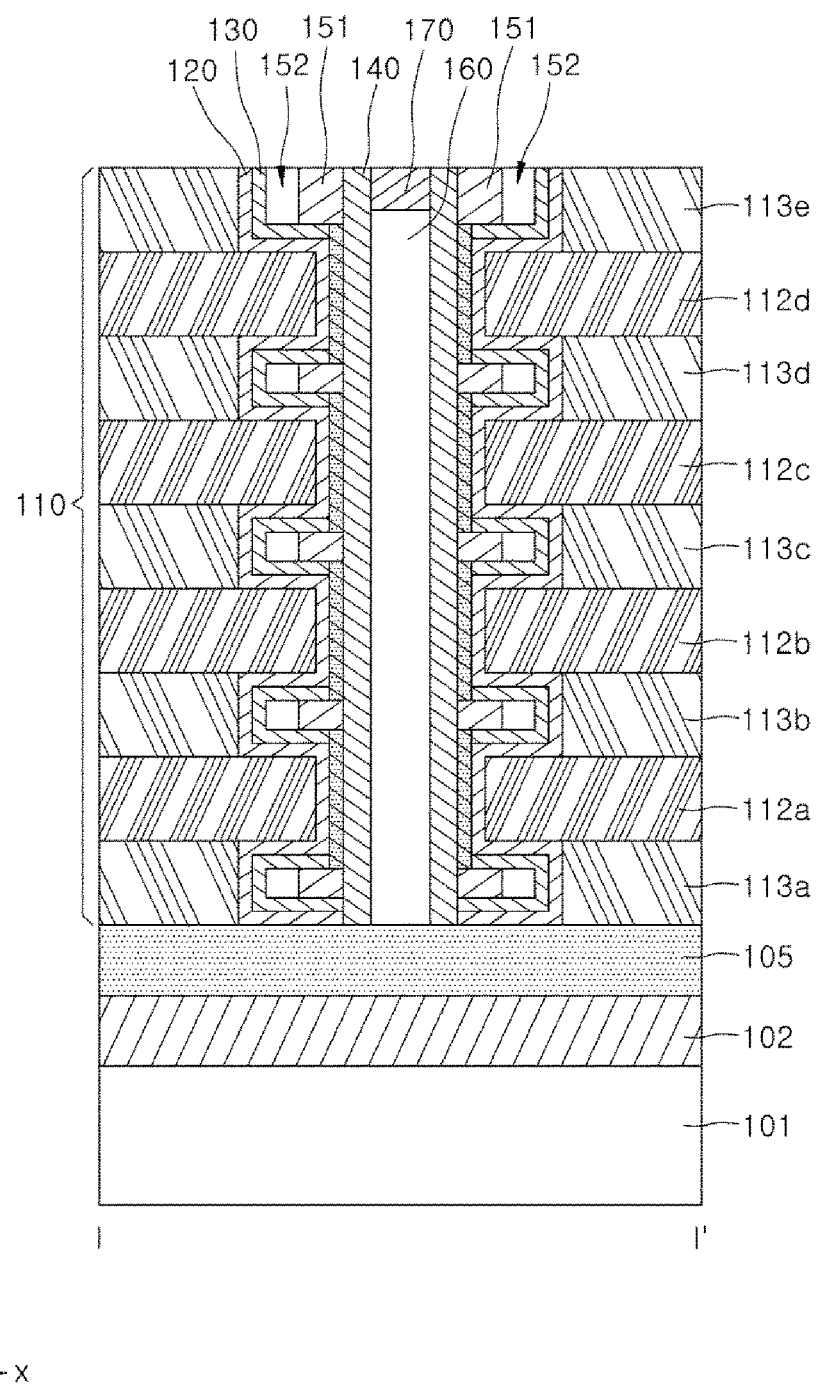
FIG. 10 is a cross-sectional view schematically illustrating a nonvolatile memory device according to another embodiment of the present disclosure.

FIG. 10 is a cross-sectional view schematically illustrating a nonvolatile memory device according to another embodiment of the present disclosure. Referring to FIG. 10, when compared to the nonvolatile memory device 1 described above with reference to FIGS. 1 to 3, the nonvolatile memory device 1a is different in the configuration of a gap filling layer 151 and the inclusion of an air gap 152. The configuration and structures, except for the gap filling layer 151 and the air gap 152, may be substantially the same as those of the nonvolatile memory device 1 described above with reference to FIGS. 1 to 3.

Referring to FIG. 10, in the nonvolatile memory device 1a, the gap filling layer 151 and the air gap 152 may be disposed in a space between the channel layer 140 and a non-contact portion (i.e., a non-cell portion) of the second functional layer 130.

The gap filling layer 151 might not completely fill the space between the channel layer 140 and the non-contact portion (i.e., the non-cell portion) of the second functional layer 130, which does not contact the channel layer 140. The gap filling layer 151 may include an insulating material. As an example, the insulating material may include oxide, nitride, oxynitride or a combination of two or more thereof. The air gap 152 may be formed in a remaining space that is not filled with the gap filling layer 151. The air gap 152 may function as an insulator. Since the dielectric constant of the air gap 152 is lower than that of insulating materials such as oxide, nitride, and oxynitride used in the gap filling layer 151, it is possible to further reduce the magnitude of parasitic capacitance caused by the insulating material disposed between the conductive layers.

Figure 11:
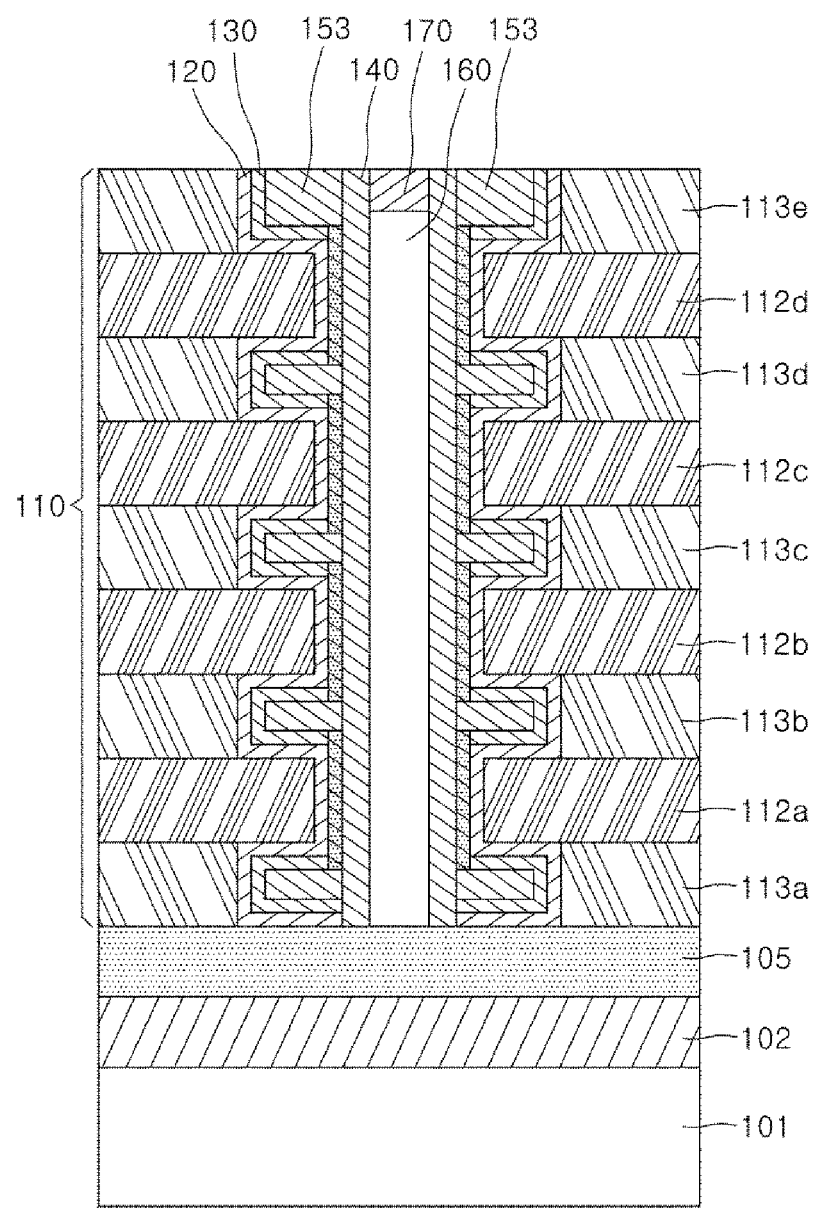
FIG. 11 is a cross-sectional view schematically illustrating a nonvolatile memory device according to yet another embodiment of the present disclosure.

FIG. 11 is a cross-sectional view schematically illustrating a nonvolatile memory device according to yet another embodiment of the present disclosure. Referring to FIG. 11, when compared to the nonvolatile memory device 1 described above with reference to FIGS. 1 to 3, the nonvolatile memory device 1b is different with respect to the configuration of a gap filling layer 153. The configuration and structures, except for the gap filling layer 153, may be substantially the same as those of the nonvolatile memory device 1 described above with reference to FIGS. 1 to 3.

Referring to FIG. 11, in the nonvolatile memory device 1b, the gap filling layer 153 is disposed in a space between the channel layer 140 and a non-contact portion of the second functional layer 130 with the channel layer 140 (i.e., a non-cell portion) and may include a material substantially the same as used in the channel layer 140.

The gap filling layer 153 may include the above-described semiconductor materials that may be used with channel layer 140. According to the embodiment, a separate process for the gap filling layer 153 can be omitted, so that there is an advantage in improving productivity in a method of manufacturing a nonvolatile memory device described later.

FIGS. 12 to 18 are cross-sectional views schematically illustrating a method of manufacturing a nonvolatile memory device according to an embodiment of the present disclosure. The manufacturing method can be applied to the manufacturing of the nonvolatile memory device 1 described above with reference to FIGS. 1 to 3.

Figure 12:
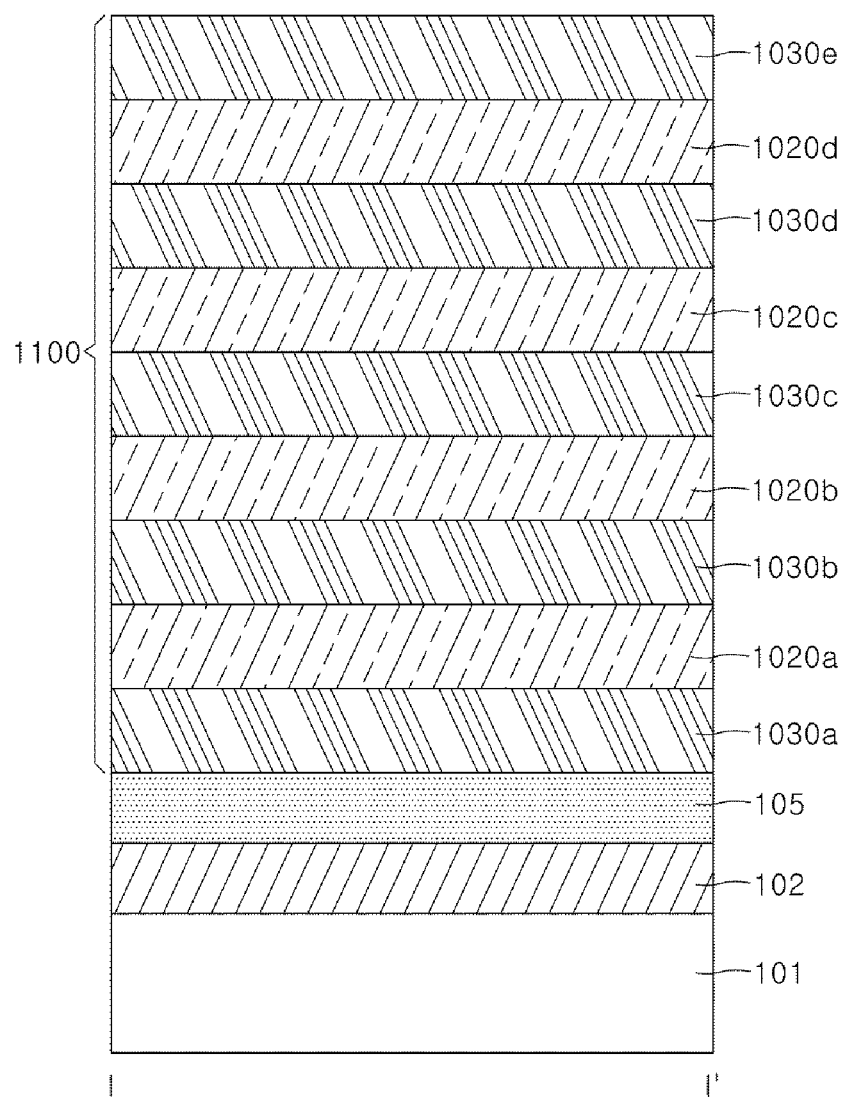
FIGS. 12 to 18 are cross-sectional views schematically illustrating a method of manufacturing a nonvolatile memory device according to an embodiment of the present disclosure.

Referring to FIG. 12, a base insulation layer 102 may be formed on a substrate 101. A channel lower contact layer 105 may be formed on the base insulation layer 102. The base insulation layer 102 and the channel lower contact layer 105 may be formed, for example, applying a chemical vapor deposition method, an atomic layer deposition method, a sputtering method, and the like.

A stack structure 1100 may be formed on the channel lower contact layer 105. The stack structure 1100 may include first to fourth sacrificial material layers 1020a, 1020b, 1020c and 1020d and first to fifth insulating material layers 1030a, 1030b, 1030c, 1030d and 1030e, which are alternately stacked. The first to fourth sacrificial material layers 1020a, 1020b, 1020c and 1020d and the first to fifth insulating material layers 1030a, 1030b, 1030c, 1030d and 1030e may have etching selectivity each other. As an example, when each of the first to fourth sacrificial material layers 1020a, 1020b, 1020c and 1020d includes oxide, each of the first to fifth insulating material layers 1030a, 1030b, 1030c, 1030d and 1030e may include nitride. As another example, when each of the first to fourth sacrificial material layers 1020a, 1020b, 1020c and 1020d includes nitride, each of the first to fifth insulating material layers 1030a, 1030b, 1030c, 1030d and 1030e may include oxide.

The first to fourth sacrificial material layers 1020a, 1020b, 1020c and 1020d and the first to fifth insulating material layers 1030a, 1030b, 1030c, 1030d and 1030e may be formed, for example, using a chemical vapor deposition method, an atomic layer deposition method, a sputtering method, and the like.

Figure 13:
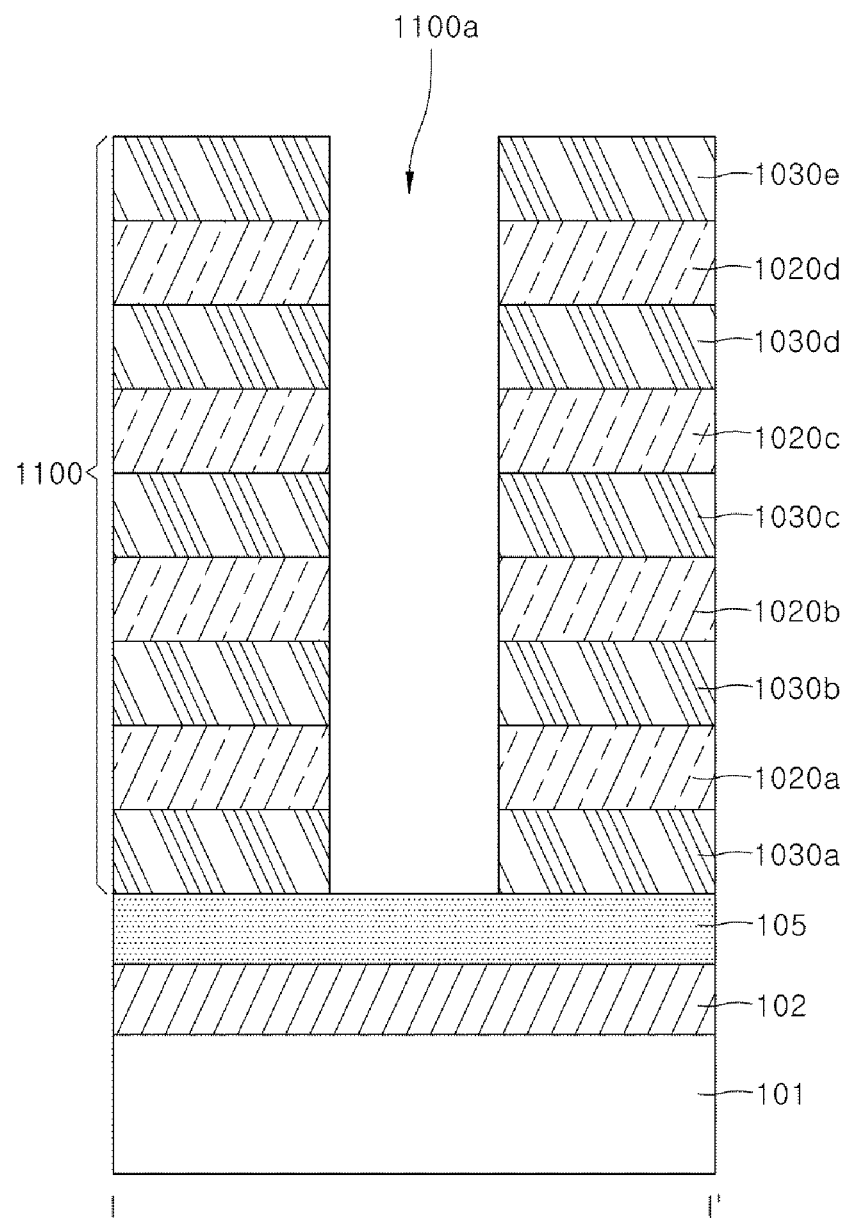

Referring to FIG. 13, the stack structure 1100 may be etched on the channel lower contact layer 105 to form a first hole pattern 1100a exposing the channel lower contact layer 105. The first hole pattern 1100a may penetrate the stack structure 1100. Although not illustrated, the first hole pattern 1100a may have a circular, elliptical, or polygonal planar shape.

Figure 14:
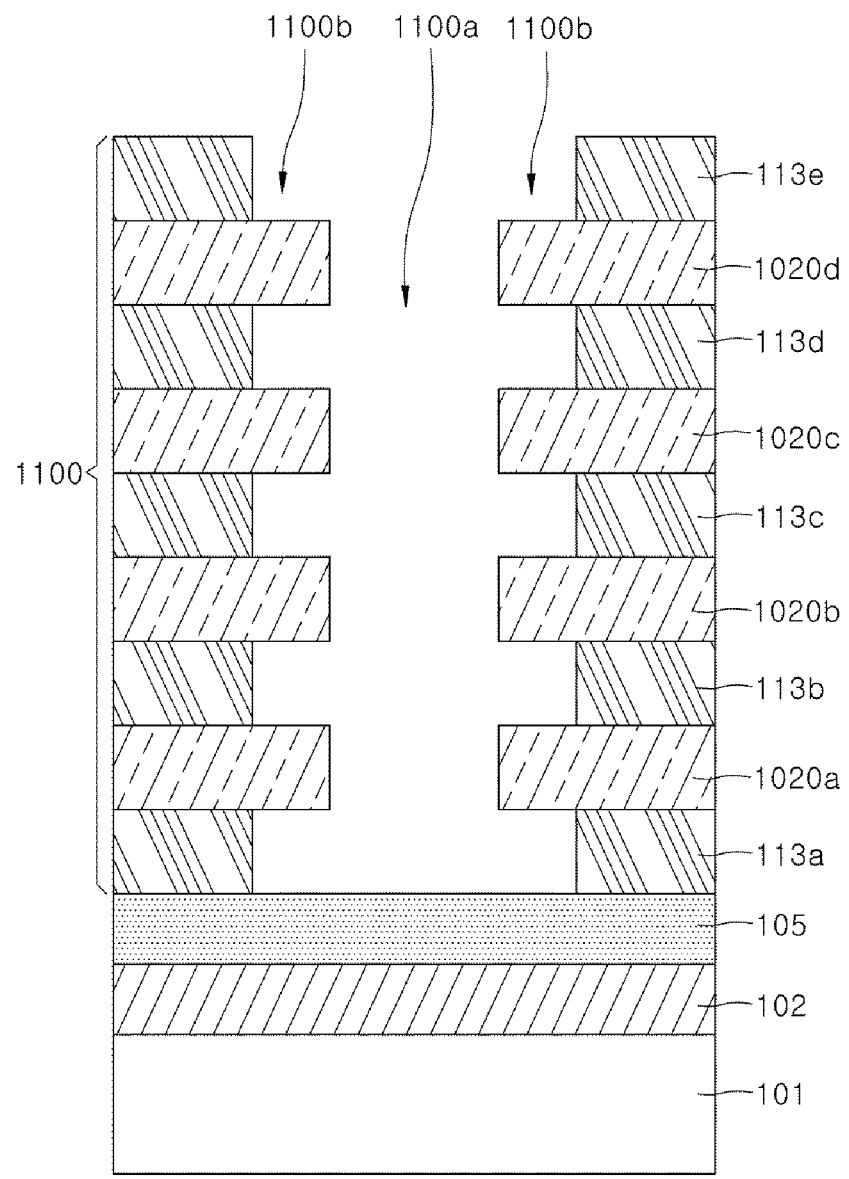

Referring to FIG. 14, the first to fifth insulating material layers 1030a, 1030b, 1030c, 1030d and 1030e may be selectively etched in a lateral direction, that is, the x-direction to form a recess region 1100b. Accordingly, the first to fifth insulating material layers 1030a, 1030b, 1030c, 1030d and 1030e may be converted into first to fifth interlayer insulation layers 113a, 113b, 113c, 113d and 113e. As an etching method with respect to the first to fifth insulating material layers 1030a, 1030b, 1030c, 1030d and 1030e, for example, a wet etching method may be applied. Accordingly, the sidewall surface of the stack structure 1100 inside the first hole pattern 1100a may have an uneven ribbed, corrugated, or curved shape.

Figure 15:
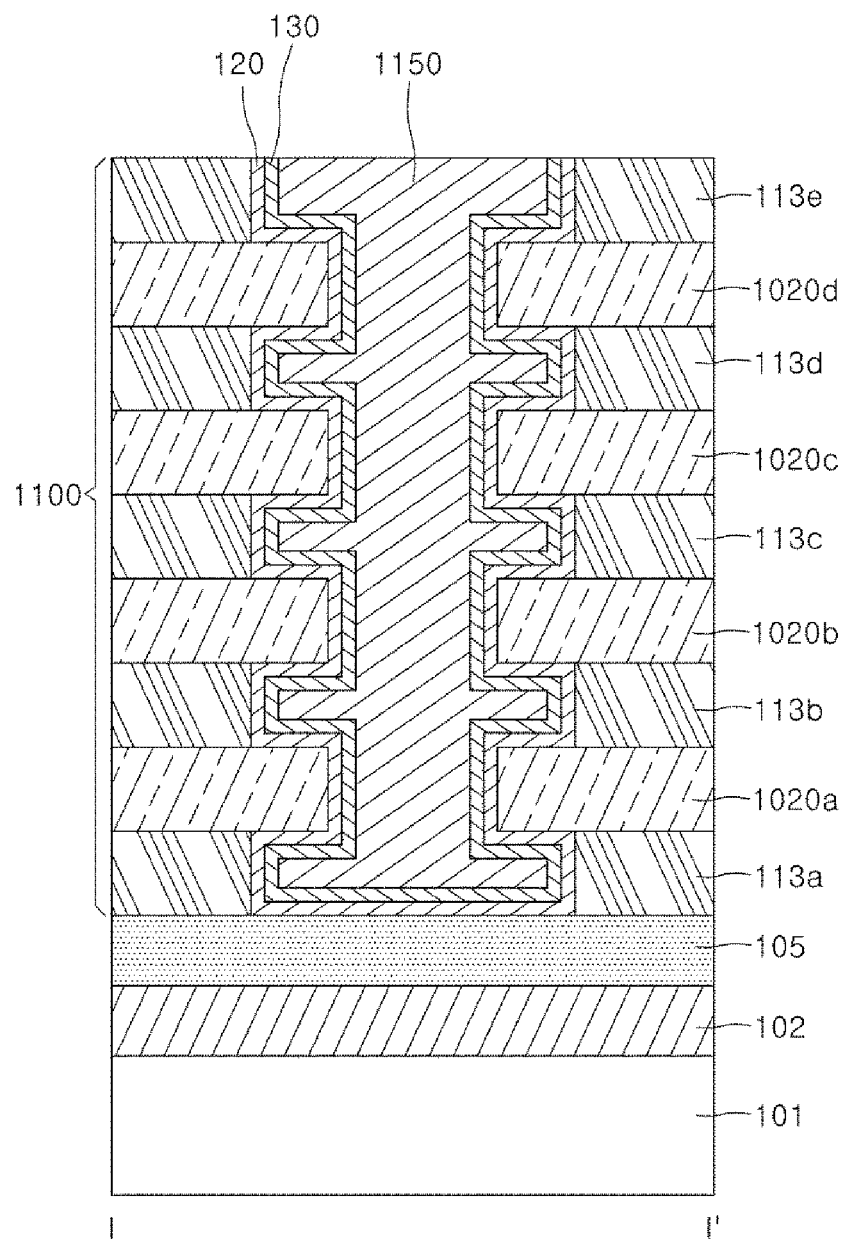

Referring to FIG. 15, a first functional layer 120 and a second functional layer 130 may be sequentially formed along an inner wall surface of the stack structure 1100 inside the first hole pattern 1100a. The first functional layer 120 and the second functional layer 130 may be formed to respectively have a predetermined thickness along the uneven, ribbed, corrugated, or curved shape of the inner wall surface of the stack structure 1100. The first functional layer 120 may include a gate insulating material. The second functional layer 130 may include the variable resistance material. The first and second functional layers 120 and 130 may be formed using, for example, a chemical vapor deposition method, an atomic layer deposition method, a sputtering method, and the like.

Subsequently, the first hole pattern 1100a, in which the first and second functional layers 120 and 130 are formed, may be filled with an insulating material 1150. As an example, the insulating material may include oxide, nitride, oxynitride, or a combination of two or more thereof. The insulating material 1150 may be formed by, for example, a chemical vapor deposition method, a coating method, and the like.

Subsequently, a planarization process may be performed to remove the first and second functional layers 120 and 130 and the portion of the insulating material 1150 that was additionally formed outside the first hole pattern 1100a in the process of filling the first hole pattern 1100a with the insulating material 1150. Accordingly, top surfaces of the first and second functional layers 120 and 130 and the insulating material 1150 may be positioned on the same plane as the top surface of the fifth interlayer insulation layer 113e.

Figure 16:
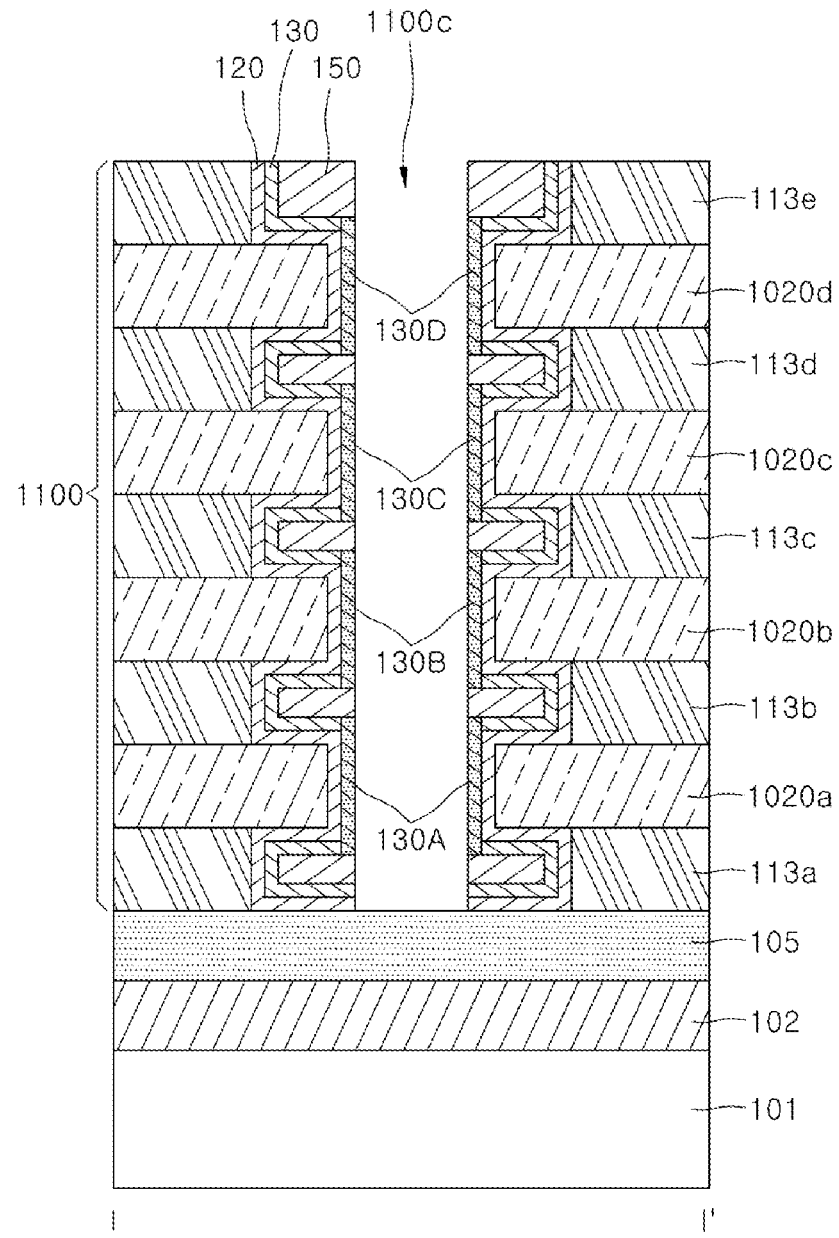

Referring to FIG. 16, the insulating material 1150 inside the first hole pattern 1100a may be patterned in a direction (i.e., the z-direction) perpendicular to the substrate 101 to form a second hole pattern 1100c exposing the channel lower contact layer 105. At this time, the second functional layer 130 may be partially exposed to the sidewall surface of the second hole pattern 1100c. Portions of second functional layer 130 corresponding to the exposed surfaces may form first to fourth cell portions 130A, 130B, 130C and 130D. In addition, the insulating material 1150 may be patterned by the second hole pattern 1100c to form a gap filling layer 150. The second hole pattern 1100c may be formed using an anisotropic etching method such as dry etching.

Figure 17:
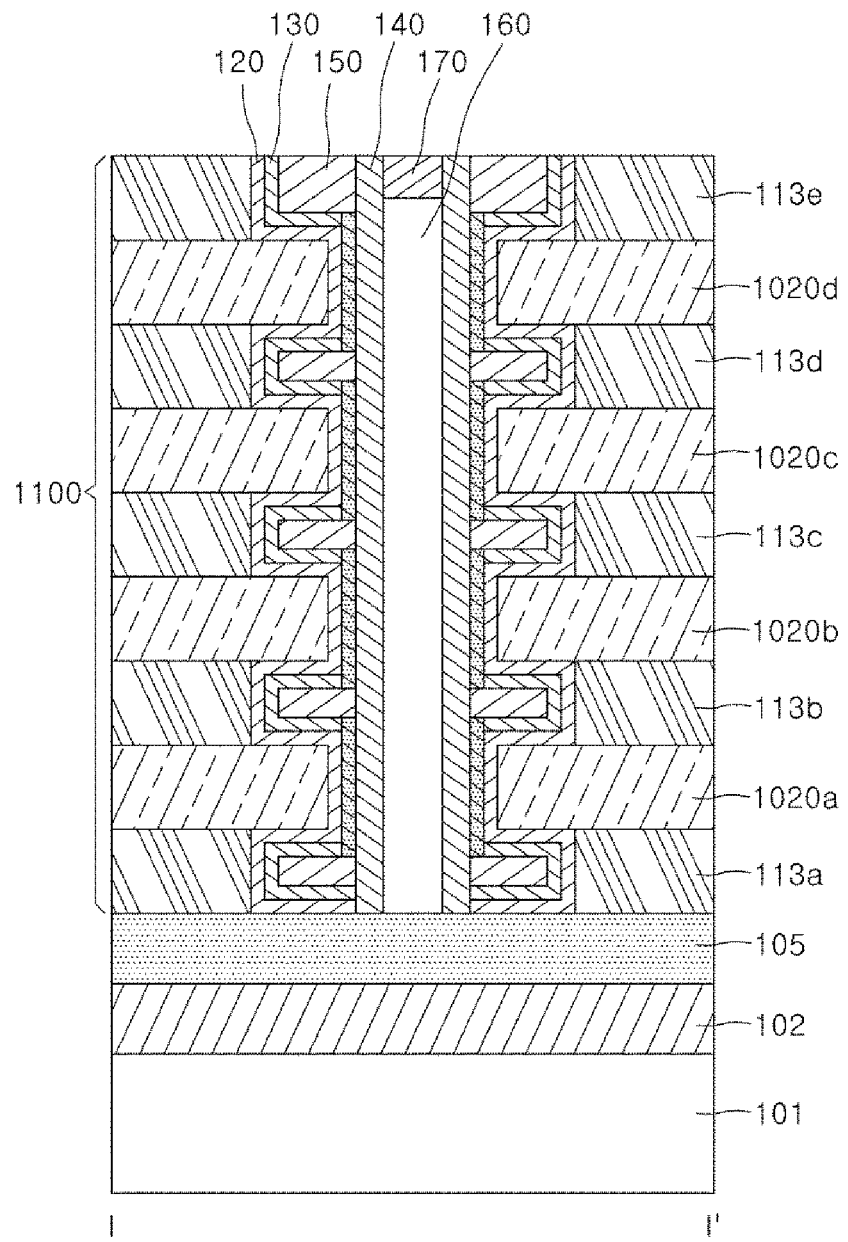

Referring to FIG. 17, a channel layer 140 may be formed on the sidewall surface of second hole pattern 1100c to have a predetermined thickness. The channel layer 140 may include a semiconductor material. The channel layer 140 may be formed, for example, using a chemical vapor deposition method, an atomic layer deposition method, and the like. The channel layer 140 may contact the channel lower contact layer 105. The channel layer 140 may contact the first to fourth cell portions 130A, 130B, 130C and 130D of the second functional layer 130 and the gap filling layer 150 of the sidewall surface of second hole pattern 1100c.

Next, the second hole pattern 1100c in which the first and second functional layers 120 and 130, the channel layer 140, and the gap filling layer 150 are disposed may be filled with an insulating material to form a core insulation structure 160. Then, the upper portion of the core insulation structure 160 may be recessed to expose a portion of the channel layer 140 in the lateral direction. A channel upper contact layer 170 may be formed in the recessed space. The channel upper contact layer 170 may contact the channel layer 140. The channel upper contact layer 170 may include a conductive material. The channel upper contact layer 170 may be formed, for example, using a chemical vapor deposition method or an atomic layer deposition method.

Figure 18:
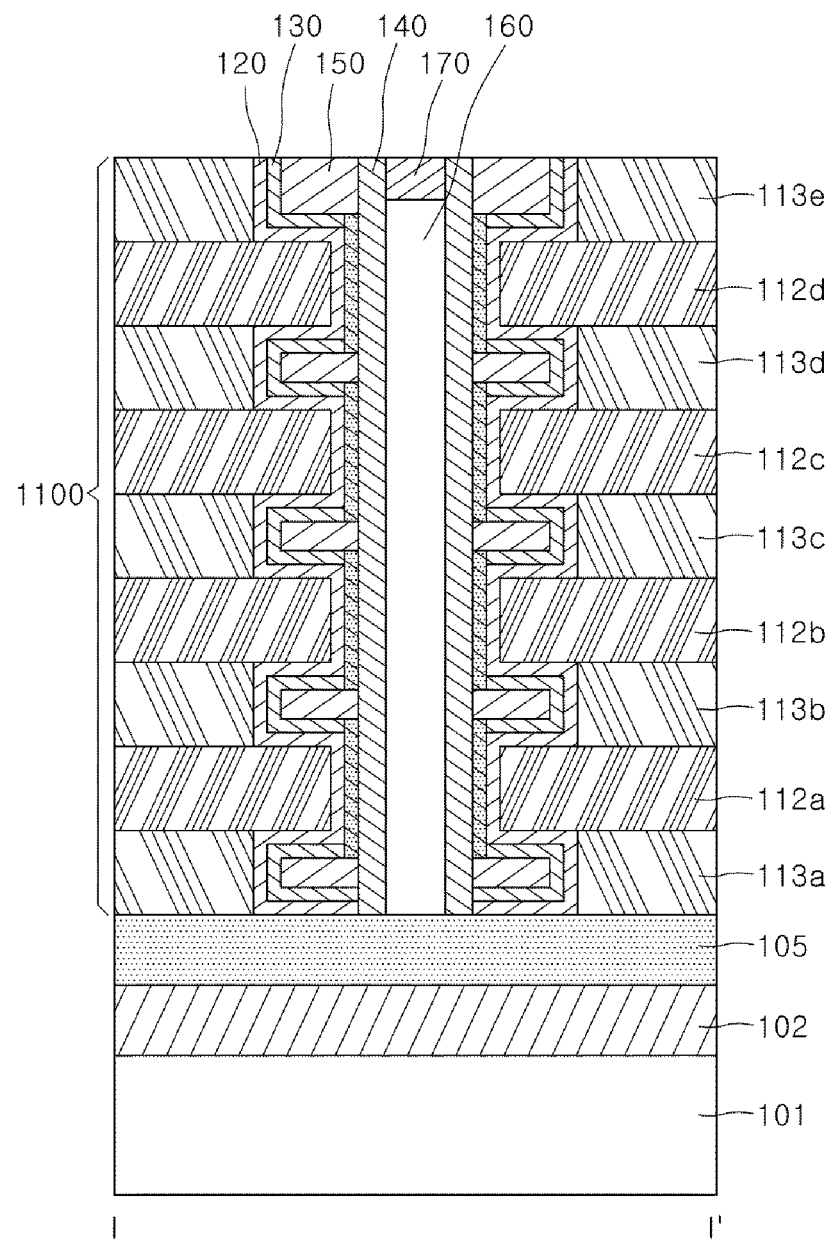

Referring to FIG. 18, the first to fourth sacrificial material layers 1020a, 1020b, 1020c and 1020d may be selectively removed using the etching selectivity with the first to fifth interlayer insulation layers 113a, 113b, 113c, 113d and 113e. In an embodiment, the first to fourth sacrificial material layers 1020a, 1020b, 1020c and 1020d may be removed, for example, by a wet etching method.

Next, in the spaces from which the first to fourth sacrificial material layers 1020a, 1020b, 1020c and 1020d are removed, a conductive material may be used to form first to fourth gate electrode layers 112a, 112b, 112c and 112d. As a method of filling the space with the conductive material, for example, a chemical vapor deposition method, an atomic layer deposition method, or the like may be applied.

The nonvolatile memory device 1 described above with reference to FIGS. 1 to 3 can be manufactured by the above-described method.

Figure 19:
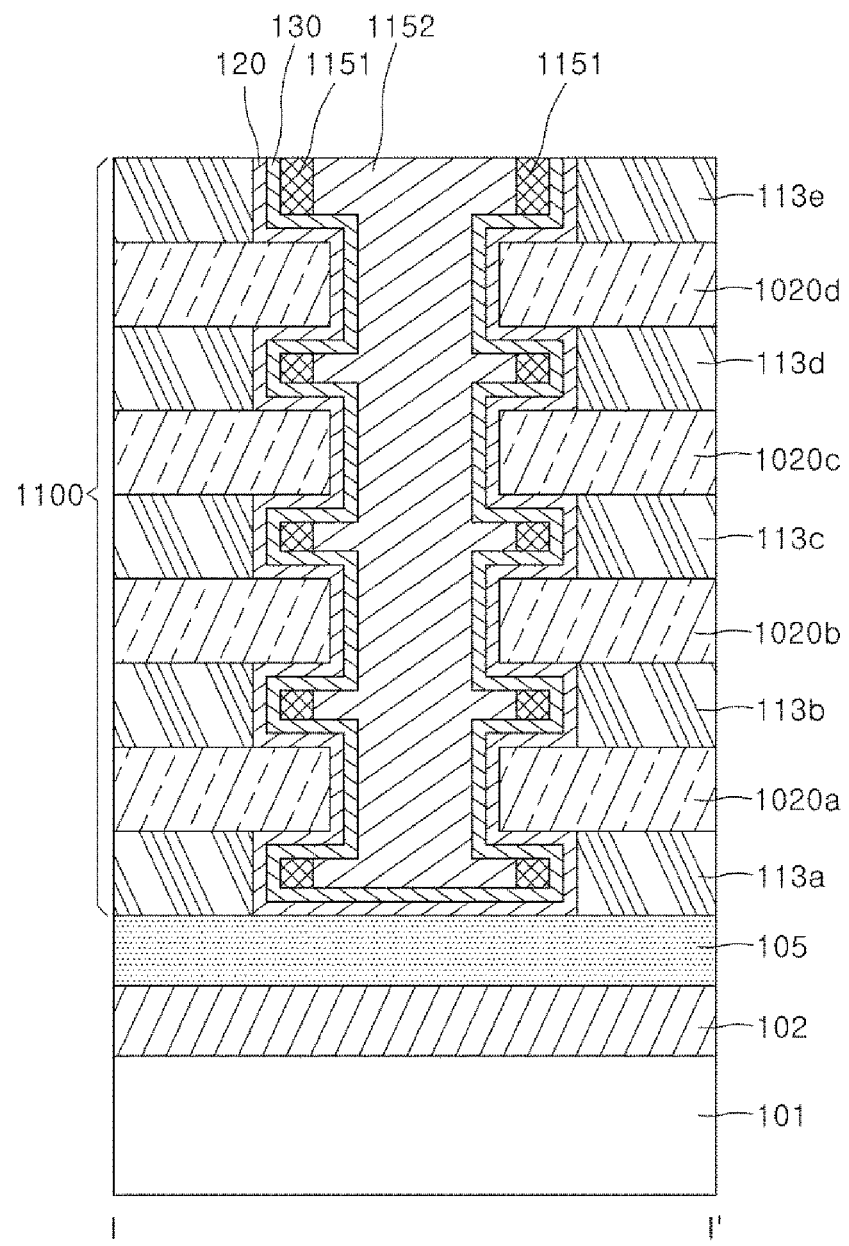
FIG. 19 is a cross-sectional view schematically illustrating a method of manufacturing a nonvolatile memory device according to another embodiment of the present disclosure.

FIG. 19 is a cross-sectional view schematically illustrating a method of manufacturing a nonvolatile memory device according to another embodiment of the present disclosure. First, the process described above in connection with FIGS. 12 to 14 may be performed. Referring to FIG. 19, a first functional layer 120 and a second functional layer 130 may be sequentially formed along the inner wall surface of a stack structure 1100 inside a first hole pattern 1100a in the structure of FIG. 14. Next, referring to FIG. 14 and FIG. 19, the recess region 1100b inside the first hole pattern 1100a may be partially filled with a first insulating material 1151. The remainder of the first hole pattern 1100a may be filled with a second insulating material 1152. The first and second insulating materials 1151 and 1152 may, for example, include oxide, nitride, oxynitride, or a combination of two or more thereof. Here, the first and second insulating materials 1151 and 1152 may have etching selectivity each other. The first and second insulating materials 1151 and 1152 may be formed, for example, by a chemical vapor deposition method, a coating method, and the like.

Subsequently, the process described above in connection with FIGS. 16 to 18 may be sequentially performed. An air gap may be formed by selectively removing the first insulating material 1151 using the etching selectivity with the second insulating material 1152. Although it is not illustrated, an etch path for providing an etching solution for selectively removing the first insulating material 1151 is provided. For example, a trench as the etch path is formed to expose portions of the first insulating material 1151 through the gate structure 110 on the channel lower contact layer 105. Through the trench, the etching solution is provided to selectively remove the first insulating material 1151. As a result, the nonvolatile memory device 1a described above with reference to FIG. 10 can be manufactured.

Figure 20:
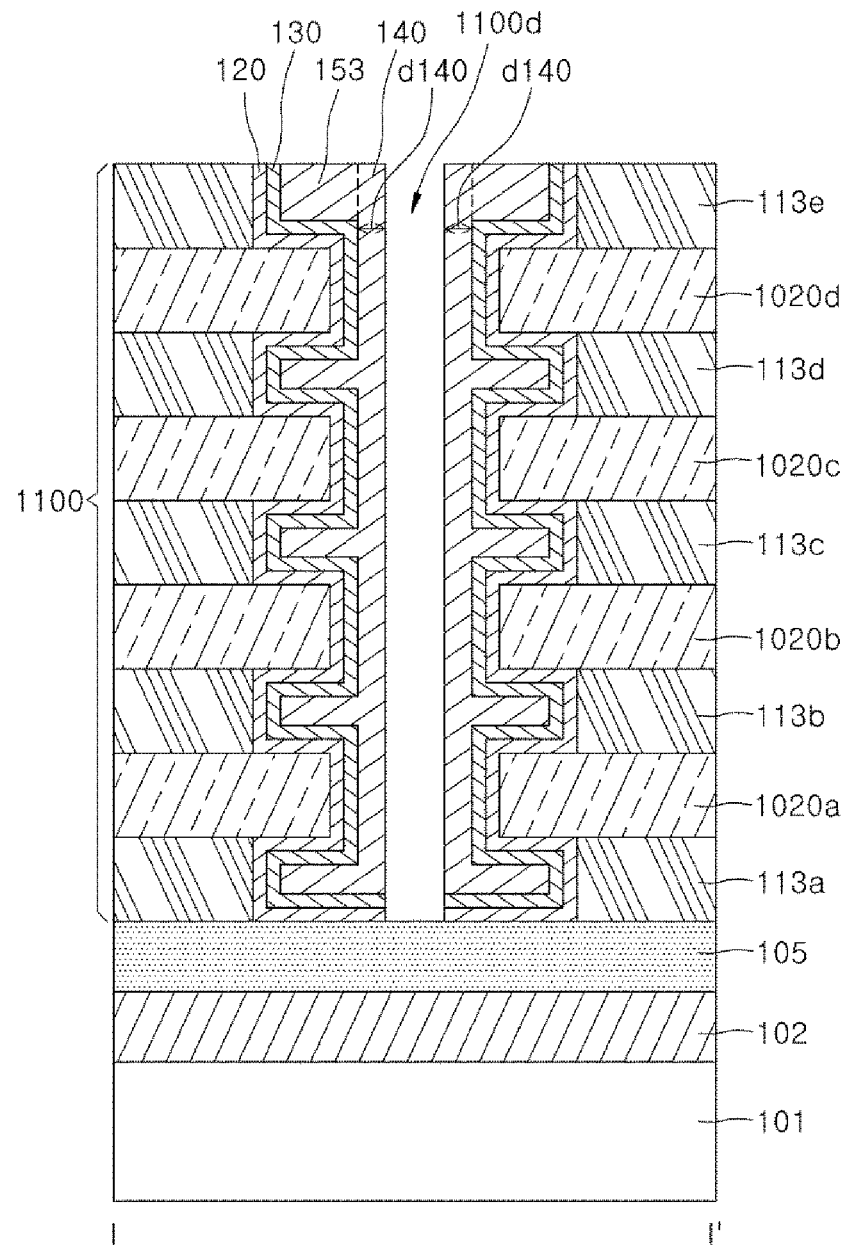
FIG. 20 is a cross-sectional view schematically illustrating a method of manufacturing a nonvolatile memory device according to yet another embodiment of the present disclosure.

FIG. 20 is a cross-sectional view schematically illustrating a method of manufacturing a nonvolatile memory device according to yet another embodiment of the present disclosure. First, the process described above in connection with FIGS. 12 to 15 may be performed. Referring to FIG. 20, the insulating material 1150 inside the first hole pattern 1100a may be patterned in a direction (i.e., the z-direction) perpendicular to the substrate 101 to form a channel pattern 1100d. The channel pattern 1100d may be a hole pattern.

A channel layer 140 having a predetermined thickness d140 and a gap filling layer 153 may be formed together by the channel pattern 1100d. The channel layer 140 and the gap filling layer 153 may include substantially the same material.

Subsequently, a core insulation structure 160 and a channel upper contact layer 170 described above with reference to FIG. 17 may be formed. The process described above with reference to FIG. 18 may be performed. As a result, the nonvolatile memory device 1b described above with reference to FIG. 11 can be manufactured.

Figure 21:
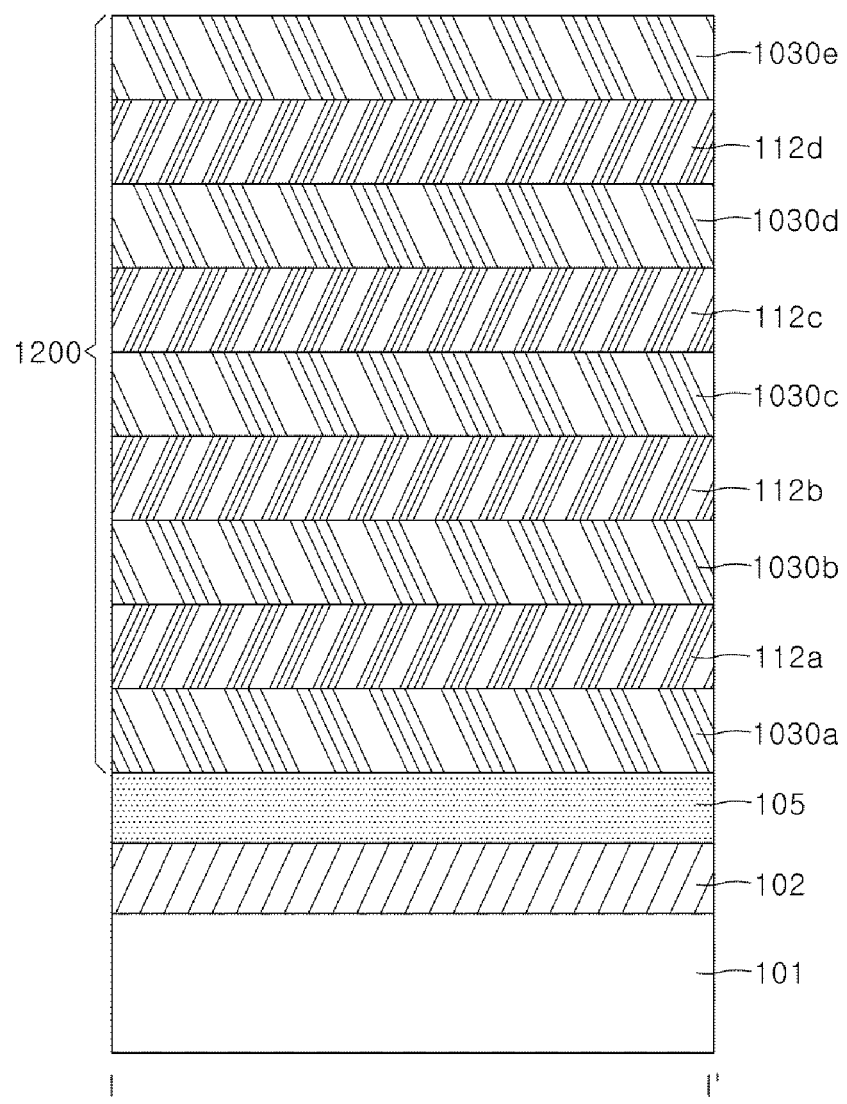
FIGS. 21 and 22 are cross-sectional views schematically illustrating a method of manufacturing a nonvolatile memory device according to yet another embodiment of the present disclosure.
Figure 22:
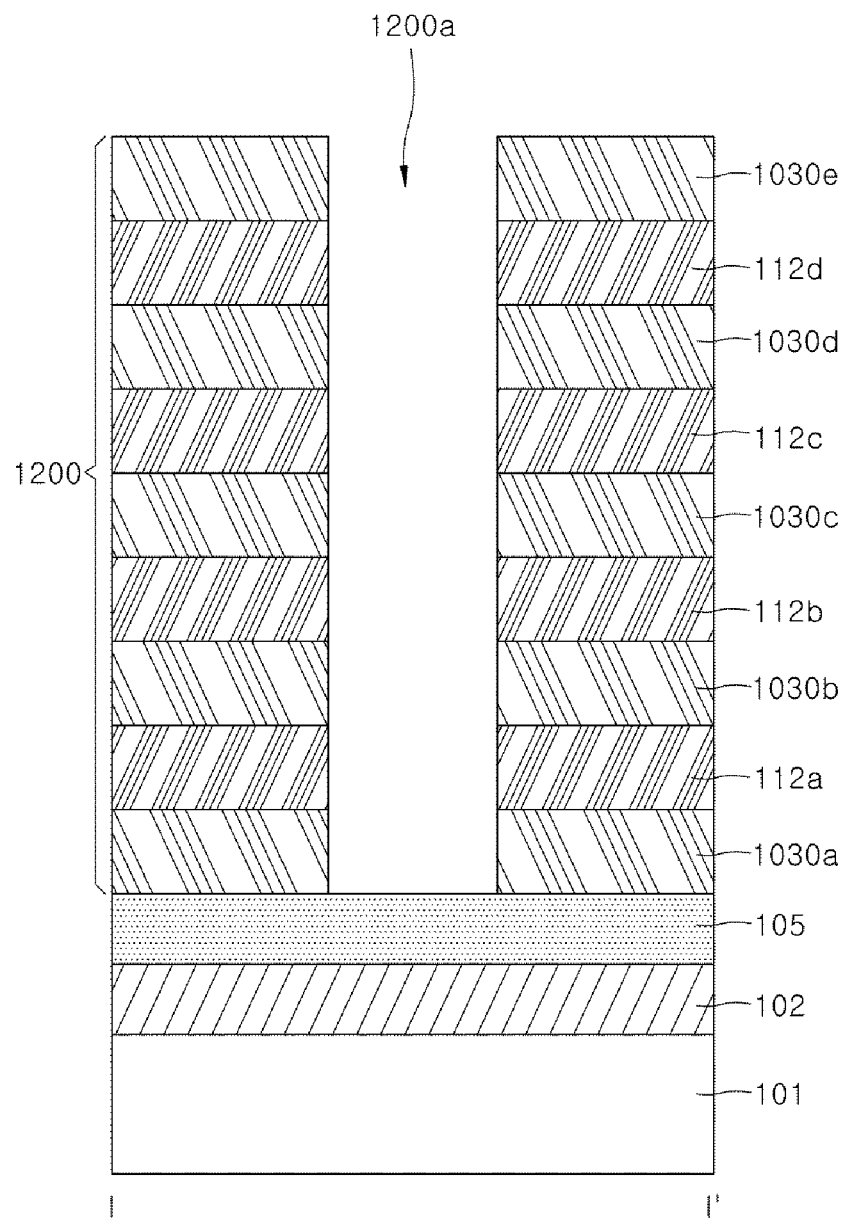

FIGS. 21 and 22 are cross-sectional views schematically illustrating a method of manufacturing a nonvolatile memory device according to yet another embodiment of the present disclosure. Referring to FIG. 21, a base insulation layer 102 may be formed on a substrate 101. A channel lower contact layer 105 may be formed on the base insulation layer 102.

Subsequently, a stack structure 1200 may be formed on the channel lower contact layer 105. The stack structure 1200 may include first to fourth gate electrode layers 112a, 112b, 112c and 112d and first to fifth insulating material layers 1030a, 1030b, 1030c, 1030d and 1030e, which are alternately stacked.

Referring to FIG. 22, the stack structure 1200 may be patterned on the channel lower contact layer 105 to form a first hole pattern 1200a exposing the channel lower contact layer 105. The first hole pattern 1200a may penetrate the stack structure 1200. Although not illustrated, the first hole pattern 1200a may have, for example, a circular, an elliptical, or a polygonal planar shape in a cross-section.

Subsequently, the process described above with reference to FIGS. 14 to 17 may be performed. As a result, the nonvolatile memory device 1 described above with reference to FIGS. 1 to 3 can be manufactured. Thus in this embodiment, the stack structure 1200 is composed of the first to fourth gate electrode layers 112a, 112b, 112c and 112d and first to fifth insulating material layers 1030a, 1030b, 1030c, 1030d and 1030e. This method does not use the first to fourth sacrificial material layers 1020a, 1020b, 1020c and 1020d described above with reference to FIGS. 12 to 18, and therefore manufacturing steps related to the processing of these sacrificial layers may be omitted.

Figure 23:
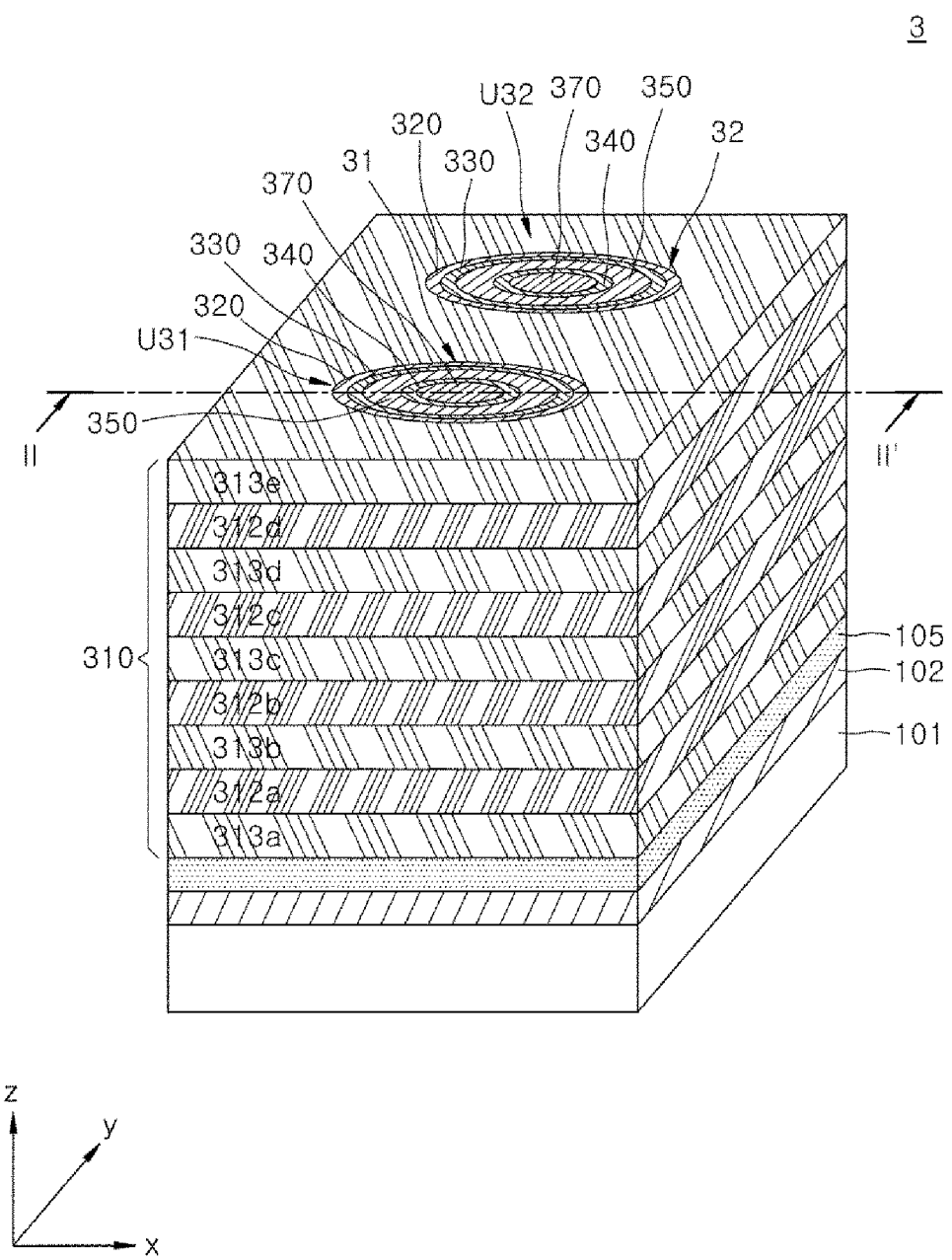
FIG. 23 is a perspective view schematically illustrating a nonvolatile memory device according to still yet another embodiment of the present disclosure.
Figure 24:
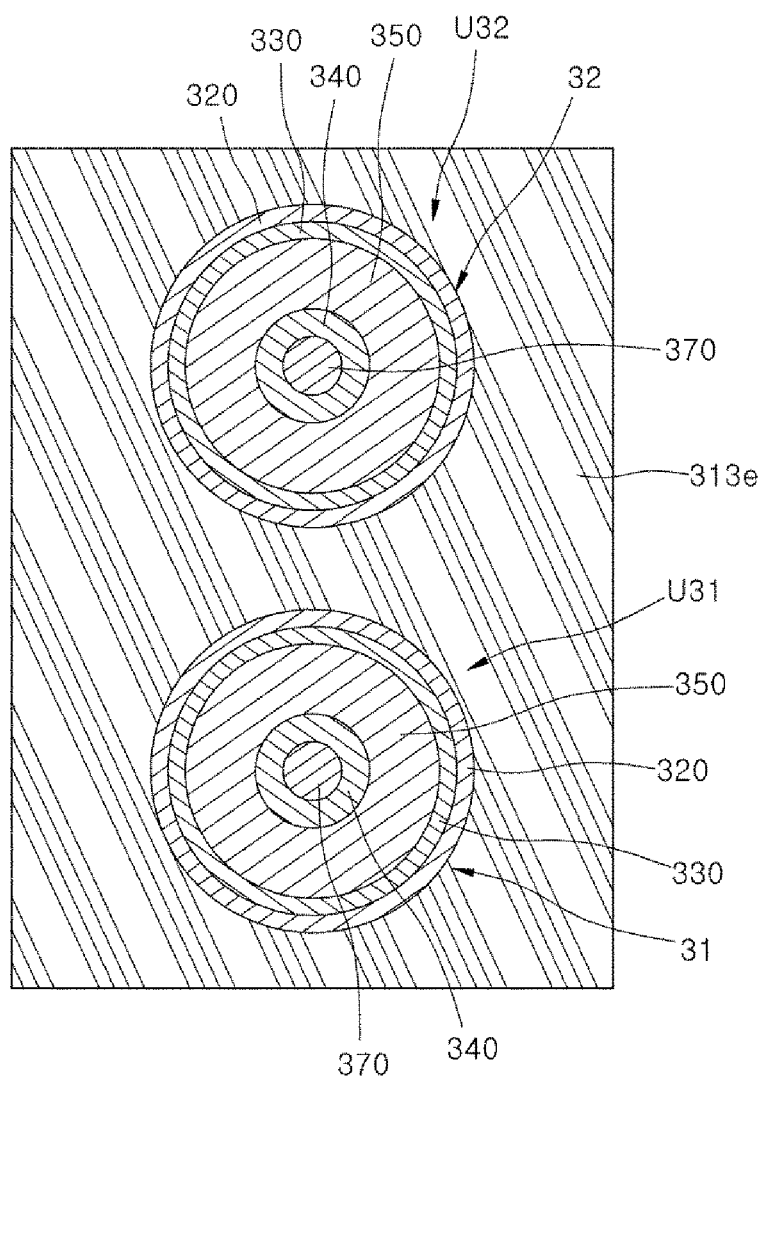
FIG. 24 is a plan view of the nonvolatile memory device of FIG. 23.
Figure 25:
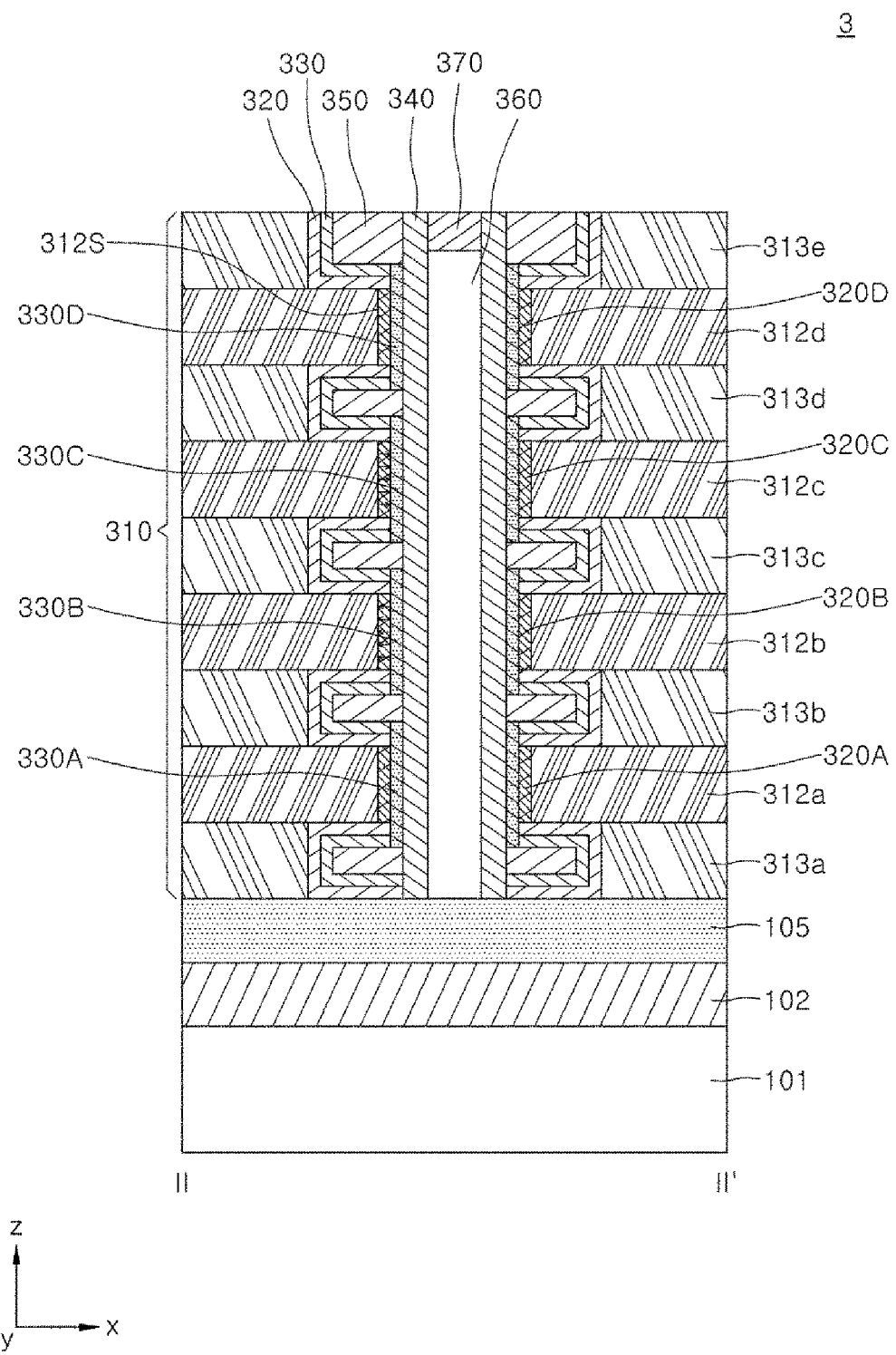
FIG. 25 is a cross-sectional view taken along a line II-II' of the nonvolatile memory device of FIG. 23.

FIG. 23 is a perspective view schematically illustrating a nonvolatile memory device according to still yet another embodiment of the present disclosure. FIG. 24 is a plan view of the nonvolatile memory device of FIG. 23. FIG. 25 is a cross-sectional view taken along the line II-II' of the nonvolatile memory device of FIG. 23.

Referring to FIGS. 23 to 25, a nonvolatile memory device 3 may be a ferroelectric memory device. In the nonvolatile memory device 3, except for first and second functional layers 320 and 330, the rest of the configuration and structures may be substantially the same as that of the nonvolatile memory device 1, which is a resistance change memory device, described above with reference to FIGS. 1 to 3.

The nonvolatile memory device 3 may include a substrate 101, a gate structure 310 that is disposed on the substrate 101 and includes hole patterns 31 and 32, first functional layers 320 disposed along a sidewall surface of the gate structure 310, inside the hole patterns 31 and 32, and second functional layers 330 disposed on the first functional layers 320 inside the hole patterns 31 and 32. The gate structure 310 may include first to fourth gate electrode layers 312a, 312b, 312c and 312d and first to fifth interlayer insulation layers 313a, 313b, 313c, 313d and 313e, which are alternately stacked. The first to fourth gate electrode layers 312a, 312b, 312c and 312d protrude toward the center of the hole patterns 31 and 32, as compared to the first to fifth interlayer insulation layers 313a, 313b, 313c, 313d and 313e, so that the sidewall surface of the gate structure 310 within the hole patterns 31 and 32 may have an uneven shape or a curved shape.

The nonvolatile memory device 3 may include a channel layer 340 extending in the z-direction on the substrate 101. The channel layer 340 may be disposed to contact first to fourth cell portions 330A, 330B, 330C and 330D of the second functional layer 330. The first to fourth cell portions 330A, 330B, 330C and 330D of the second functional layer 330 may indirectly cover the sidewall surfaces 312S of the first to fourth gate electrode layers 312a, 312b, 312c and 312d. That is, with the first functional layer 320 interposed therebetween, the first to fourth cell portions 330A, 330B, 330C and 330D of the second functional layer 330 may face the sidewall surfaces 312S of the protruding first to fourth gate electrode layers 312a, 312b, 312c and 312d. Referring to FIG. 25, a portion of the first functional layer 320 may be disposed to contact the sidewall surfaces 312S of the first to fourth gate electrode layers 312a, 312b, 312c and 312d. The first to fourth cell portions 330A, 330B, 330C and 330D of the second functional layer 330 may be disposed to contact the portion of the first functional layer 320 which contacts the sidewall surfaces 312S of the first to fourth gate electrode layers 312a, 312b, 312c and 312d.

In addition, the nonvolatile memory device 3 may have a gap filling layer 350 in a region adjacent to the channel layer 340. The gap filling layer 350 may be disposed between the channel layer 340 and the non-contact portion (i.e., the non-cell portion) of the second functional layer 330, which does not contact the channel layer 340.

The nonvolatile memory device 3 may further include core insulation structures 360 disposed inside the hole patterns 31 and 32, in which the first and second functional layers 320 and 330, the channel layer 340 and the gap filling layer 350 are disposed. The nonvolatile memory device 3 may further include a channel lower contact layer 105 that is disposed between the substrate 101 and the gate structure 310 and contacts one end of the channel layer 340. The channel lower contact layer 105 may be electrically connected to a source electrode (not illustrated). The nonvolatile memory device 3 may further include a base insulation layer 102 disposed between the substrate 101 and the channel lower contact layer 105.

The nonvolatile memory device 3 may further include a channel upper contact layer 370 disposed on the core insulation layer 360. The channel upper contact layer 370 may contact the other end of the channel layer 340. For example, the channel upper contact layer 370 may contact the other end of the channel layer 340 disposed from the one end of the channel layer 340 in a direction (i.e., the z-direction) perpendicular to the substrate 101.

In the embodiment, the first functional layer 320 may be a ferroelectric memory layer. The first functional layer 320 may include a ferroelectric material. The ferroelectric material may be a material having a spontaneous electrical polarization in a state in which no external electric field is applied.

In an embodiment, the ferroelectric material may exhibit a polarization hysteresis behavior including a switching of the electrical polarization when an external electric field is applied. After the external electric field is removed, the ferroelectric material can maintain either of two stable remanent polarization states resulting from the polarization hysteresis behavior in a non-volatile manner. The two stable remanent polarization states may have different polarization orientations. As an example, this characteristic of the remanent polarization can be used to non-volatilely store signal information of "0" and "1", respectively. The ferroelectric material may be, for example, hafnium oxide, zirconium oxide, hafnium zirconium oxide, or a combination of two or more thereof.

Referring to FIG. 25, the first functional layer 320 may include first to fourth memory portions 320A, 320B, 320C and 320D that overlap the sidewall surfaces of the first to fourth gate electrode layers 312a, 312b, 312c and 312d in the x-direction, respectively. As described below, the remanent polarization of the corresponding first to fourth memory cells MC1, MC2, MC3 and MC4 may be stored in the first to fourth memory portions 320A, 320B, 320C and 320D.

The second functional layer 330 may be an interfacial insulation layer. The second functional layer 330 may function as a barrier layer to prevent material diffusion between the channel layer 340 and the first functional layer 320, which is a ferroelectric memory layer. In addition, when the first functional layer 320 and the channel layer 340 have different lattice constants, the second functional layer 330 can prevent direct contact between the first functional layer 320 and the channel layer 340. As the density of the crystal defects increases, the reliability of the polarization switching operation of the first functional layer 320 may decrease and the durability of the polarization switching operation may deteriorate. As a result, the second functional layer 330 may prevent crystal defects from occurring due to lattice mismatch at an interface between the first functional layer 320 and the channel layer 340.

Figure 26A:
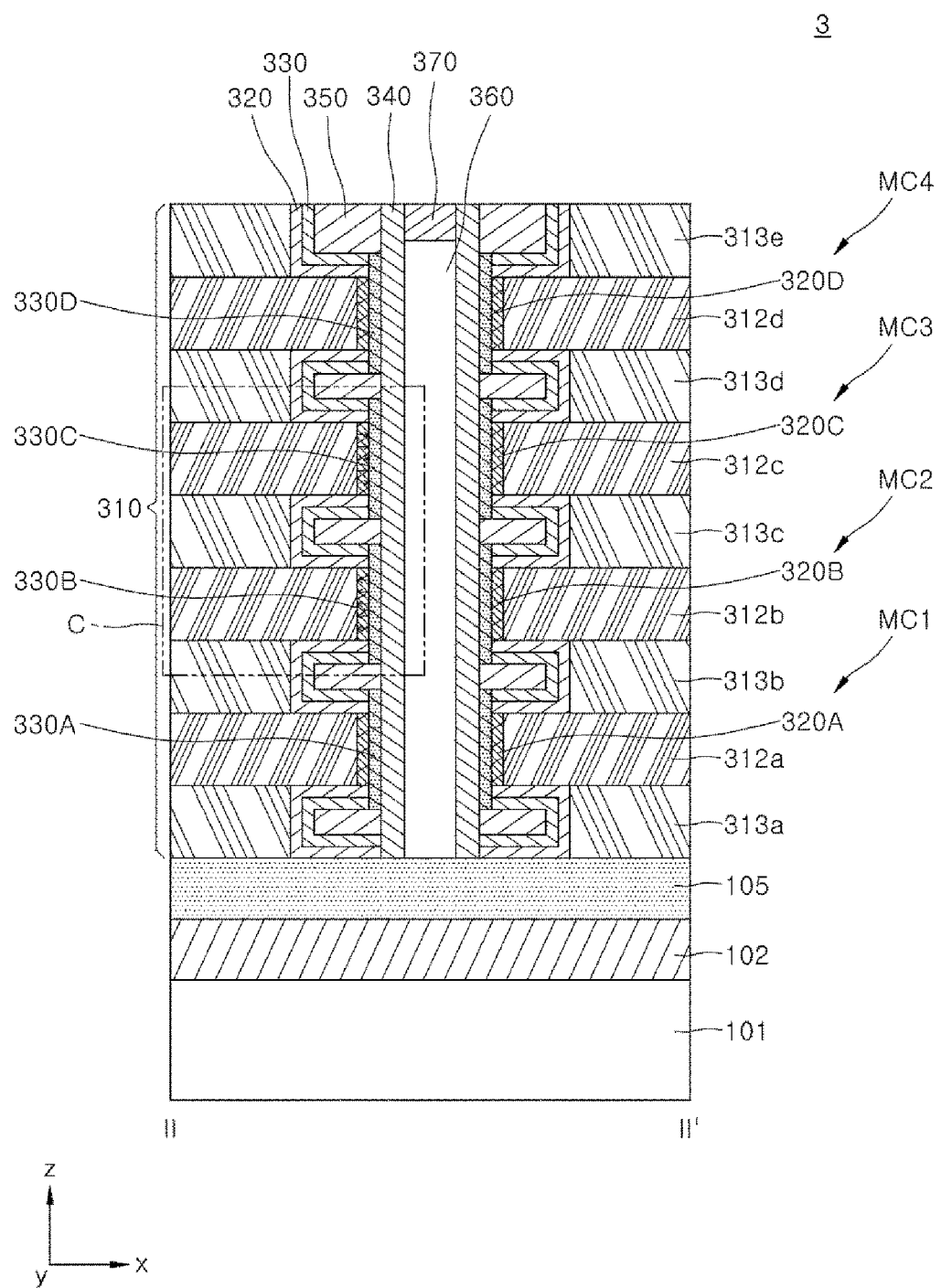
FIG. 26A is a view schematically illustrating an operation method of a nonvolatile memory device according to an embodiment of the present disclosure.
Figure 26B:
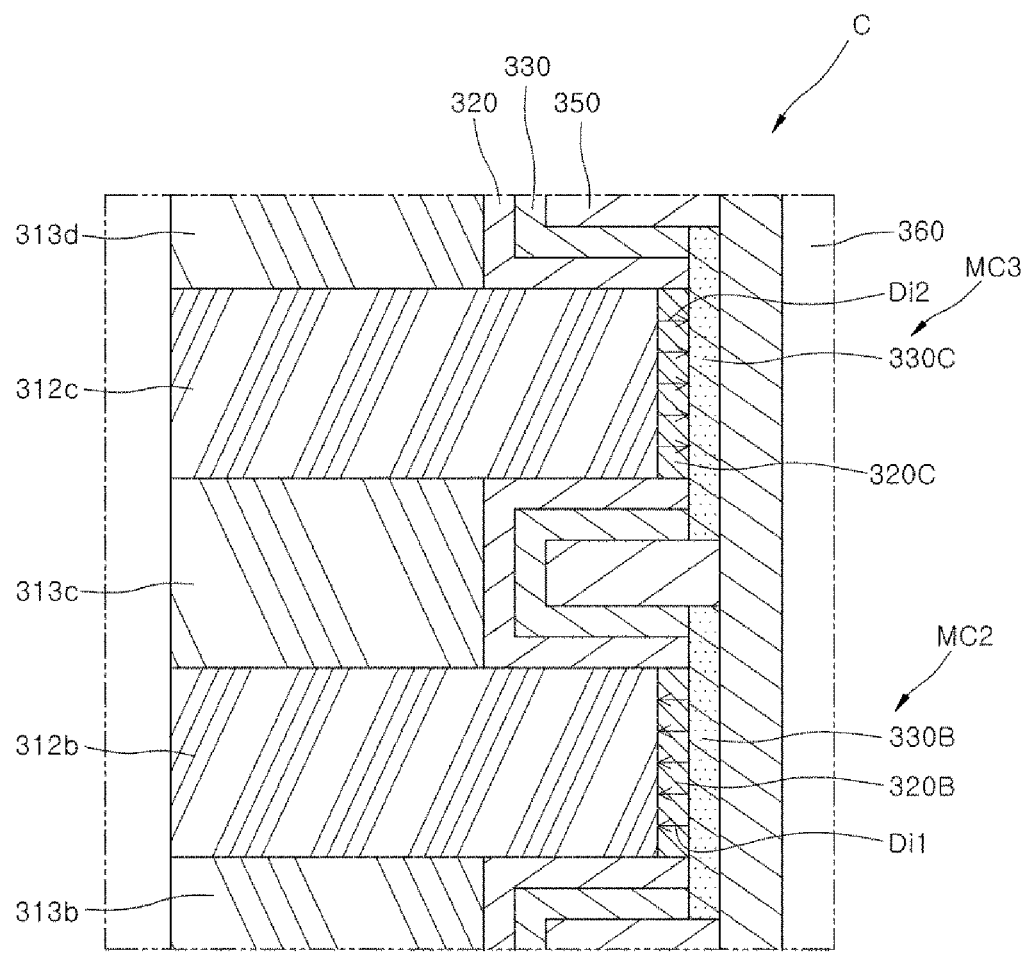
FIG. 26B is an enlarged view of area 'C' of FIG. 26A.

FIG. 26A is a view schematically illustrating an operation method of a nonvolatile memory device according to an embodiment of the present disclosure. FIG. 26B is an enlarged view of area 'C' of FIG. 26A. The nonvolatile memory device 3 of FIGS. 26A and 26B may be the ferroelectric memory device described above in connection with FIGS. 23 to 25.

Referring to FIGS. 26A and 26B, the nonvolatile memory device 3 may include first to fourth memory cells MC1, MC2, MC3 and MC4. The first to fourth memory cells MC1, MC2, MC3 and MC4 may constitute a string of a transistor-type nonvolatile memory elements connected in series with each other. The first memory cell MC1 may include a first gate electrode layer 312a, a first memory portion 320A of a first functional layer 320, and a first cell portion 330A of a second functional layer 330. The second memory cell MC2 may include a second gate electrode layer 312b, a second memory portion 320B of the first functional layer 320, a second cell portion 330B of the second functional layer 330. The third memory cell MC3 may include a third gate electrode layer 312c, a third memory portion 320C of the first functional layer 320, and a third cell portion 330C of the second functional layer 330. The fourth memory cell MC4 may include a fourth gate electrode layer 312d, a fourth memory portion 320D of the first functional layer 320, a fourth cell portion 330D of the second functional layer 330. A channel layer 340 may be shared by the first to fourth memory cells MC1, MC2, MC3 and MC4.

A write operation for the second memory cell MC2 will be described with reference to FIGS. 26A and 26B. A voltage may be applied between a channel lower contact layer 105 and a channel upper contact layer 370 and a current having a predetermined magnitude may flow through the channel layer 340. Then, a first write voltage of a predetermined threshold voltage or higher may be applied to the second gate electrode layer 312b. With respect to the first gate electrode layer 312a, the third gate electrode layer 312c and the fourth gate electrode layer 312d, no voltage or a voltage having a magnitude less than the threshold voltage may be applied. The first write voltage may have a negative polarity. Accordingly, the internal polarization of the second memory portion 320B of the first functional layer 320 may be switched and aligned. In addition, after the first write voltage is removed from the second gate electrode layer 312b, first remanent polarization Di1 may be formed in the second memory portion 320B. The first remanent polarization Di1 may have a first orientation from the channel layer 340 toward the second gate electrode 312b.

Next, a write operation for the third memory cell MC3 will be described. A voltage may be applied between the channel lower contact layer 105 and the channel upper contact layer 370 to flow a current having a predetermined magnitude through the channel layer 340. Then, a second write voltage of a predetermined threshold voltage or higher may be applied to the third gate electrode layer 312c. With respect to the first gate electrode layer 312a, the second gate electrode layer 312b and the fourth gate electrode layer 312d, no voltage or a voltage having a magnitude less than the threshold voltage may be applied. The second write voltage may have a positive polarity. Accordingly, the internal polarization of the third memory portion 320C of the first functional layer 320 may be switched and aligned. In addition, after the second write voltage is removed from the third gate electrode layer 312c, second remanent polarization Di2 may be formed in the third memory portion 320C. The second remanent polarization Di2 may have a second orientation from the third gate electrode 312c toward the channel layer 340.

Meanwhile, a read operation for the nonvolatile memory device 3 including the first to fourth memory cells MC1, MC2, MC3 and MC4 may be performed as follows. For example, read operations for the second memory cell MC2 and the third memory cell MC3 will be described, respectively. First, a predetermined reference voltage may be applied to the first to fourth gate electrode layers 312a, 312b, 312c and 312d. The reference voltage cannot change the polarization state inside the first to fourth memory portions 320A, 320B, 320C and 320D, but the reference voltage may be a voltage large enough to turn on all of the transistors of the first to fourth memory cells MC1, MC2, MC3 and MC4. Accordingly, a conductive channel can be formed in the channel layer 340 along the z-direction. Then, when a source-drain voltage is applied between the channel lower contact layer 105 and the channel upper contact layer 370, a channel current having a constant magnitude can be developed between the channel lower contact layer 105 and the channel upper contact layer 370, regardless of the remanent polarization states stored in the first to fourth memory portions 320A, 320B, 320C and 320D.

Subsequently, the magnitude of the gate voltage applied to the second gate electrode layer 312b corresponding to the second memory cell MC2 to be read may be changed. Specifically, while reducing the magnitude of the gate voltage to be less than the magnitude of the reference voltage, the threshold magnitude of the gate voltage capable of securing a current equal to the channel current may be read.

Meanwhile, in the same way, after flowing the channel current between the channel lower contact layer 105 and the upper channel contact layer 370, the magnitude of the gate voltage applied to the third gate electrode layer 312c corresponding to the third memory cell MC3 to be read may be changed. While reducing the magnitude of the gate voltage to be less than the magnitude of the reference voltage, the threshold magnitude of the gate voltage capable of securing a current equal to the channel current may be read.

As an example, as illustrated in FIGS. 26A and 26B, the first remanent polarization Di1 is stored in the second memory portion 320B corresponding to the second memory cell MC2. In this case, the first remanent polarization Di1 may result from positive charges in the second memory portion 320B adjacent to the second gate electrode layer 312b and negative charges in the second memory portion 320B adjacent to the channel layer 340. At this time, a threshold magnitude of the gate voltage applied to the second gate electrode layer 312b, which can secure a current equal to the channel current, may be measured.

As another example, as illustrated in FIGS. 26A and 26B, the second remanent polarization Di2 is stored in the third memory portion 320C corresponding to the third memory cell MC3. In this case, the second remanent polarization Di2 may distribute negative charges in the second memory portion 320C adjacent to the third gate electrode layer 312c, and may distribute positive charges in the third memory portion 320C adjacent to the channel layer 340. At this time, a threshold magnitude of the gate voltage applied to the third gate electrode layer 312c, which can secure a current equal to the channel current, may be measured.

As described above, the polarity of the charge disposed closer to the channel layer 340 may differ between second memory portion 320B and third memory portion 320C. Consequently, the threshold magnitude of the gate voltage corresponding to the third memory cell MC3 in which the second remanent polarization Di2 is stored may be smaller than the threshold magnitude of the gate voltage corresponding to the second memory cell MC2 in which the first remanent polarization Di1 is stored. As previously described, the remanent polarization information stored in a memory cell can be identified by measuring the threshold magnitude of the gate voltage corresponding to a memory cell to be read. As a result, the signal information stored in the memory cells MC2 and MC3 can be read.

Figure 27A:
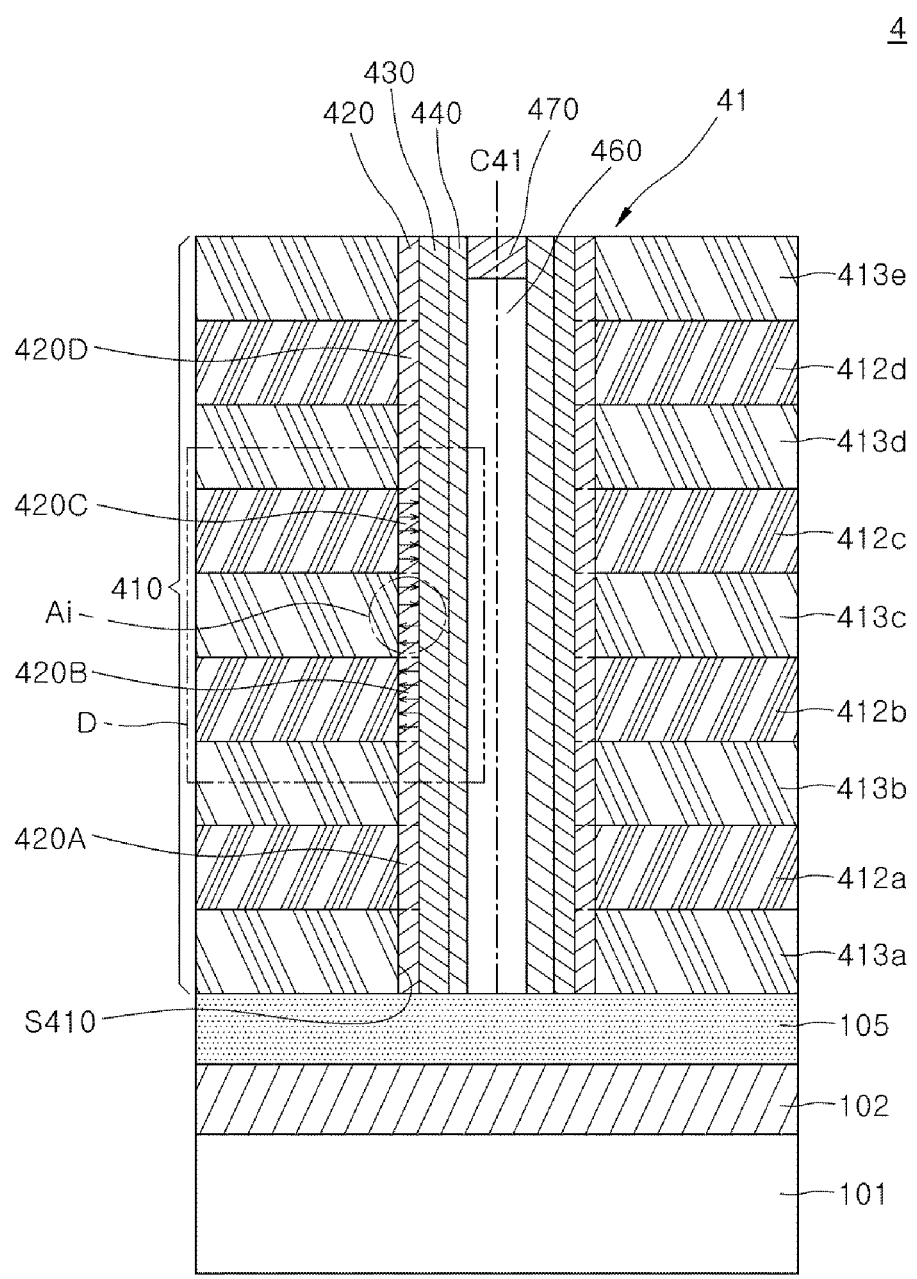
FIG. 27A is a cross-sectional view illustrating a nonvolatile memory device according to a comparative example.
Figure 27B:
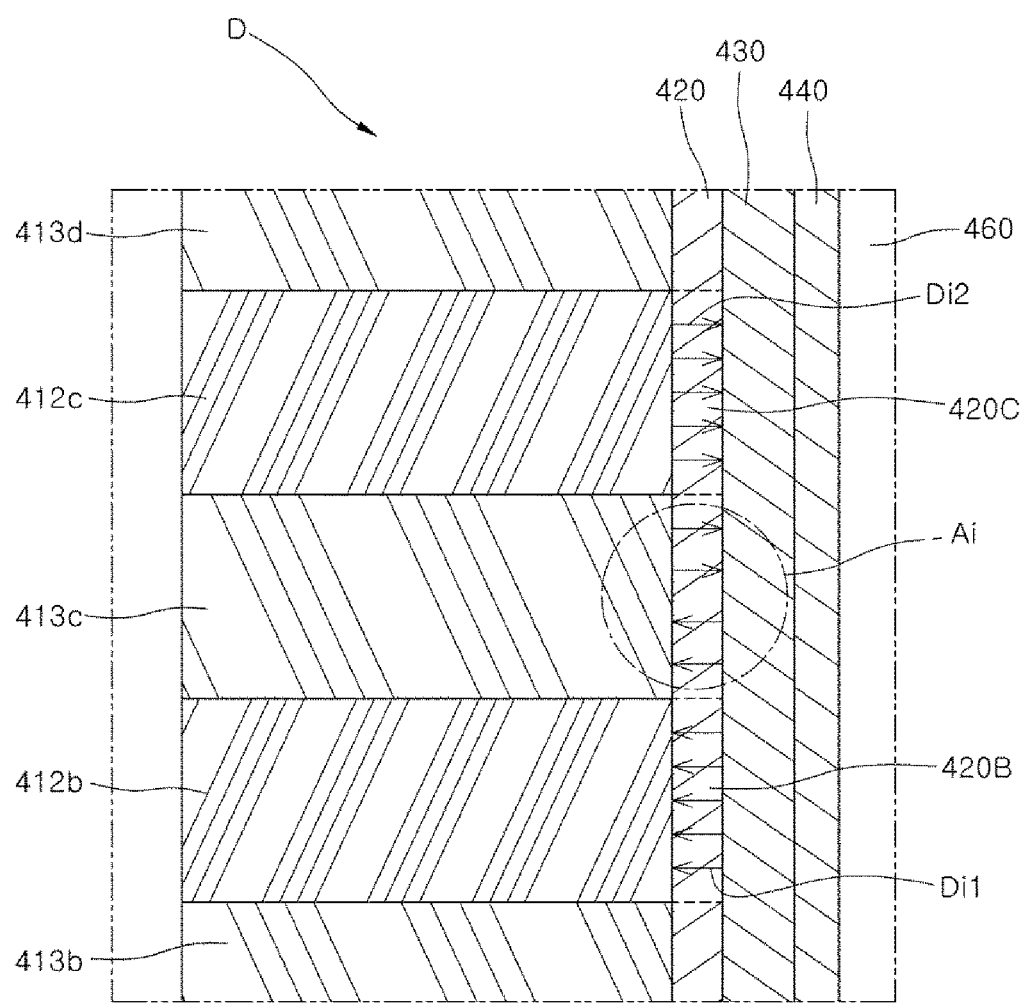
FIG. 27B is an enlarged view of area 'D' of FIG. 27A.

FIG. 27A is a cross-sectional view illustrating a nonvolatile memory device according to a comparative example. FIG. 27B is an enlarged view of area 'D' of FIG. 27A. Referring to FIGS. 27A and 27B, the configuration of a nonvolatile memory device 4 according to a comparative example may be substantially the same as the configuration of the nonvolatile memory device 3 according to an embodiment of the present disclosure, except for sidewall shapes of a gate structure 410, a first functional layer 420 and a second functional layer 430.

Referring to FIGS. 27A and 27B, the nonvolatile memory device 4 has the gate structure 410 that is disposed on a channel lower contact layer 105 and has a hole pattern 41. The gate structure 410 has first to fourth gate electrode layers 412a, 412b, 412c and 412d and first to fifth interlayer insulation layers 413a, 413b, 413c, 413d and 413e, which are alternately stacked. Compared to embodiments of the present disclosure, the first to fourth gate electrode layers 412a, 412b, 412c and 412d do not protrude in the x-direction, that is, toward the center C41 of the hole pattern 41. Accordingly, sidewall surfaces S410 of the gate structure 410 may be substantially parallel and continuous in the z-direction to have a substantially uniform cross-section. As a result, the first functional layer 420, the second functional layer 430, and a channel layer 440 may be disposed to be uniformly parallel in the z-direction to the sidewall surface S410 of the gate structure 410.

Referring to FIGS. 27A and 27B again, the first functional layer 420 may include first to fourth memory portions 420A, 420B, 420C and 420D controlled by the first to fourth gate electrode layers 412a, 412b, 412c and 412d, respectively. The first to fourth memory portions 420A, 420B, 420C and 420D may be portions of the first functional layer 420, which overlap the first to fourth gate electrode layers 412a, 412b, 412c and 412d, respectively, in the x-direction.

FIGS. 27A and 27B schematically illustrate errors that may occur during a write operation of the nonvolatile memory device 4 in a comparative example. When remanent polarization is recorded in the second memory portion 420B and the third memory portion 420C, for example, a remanent polarization may also be stored in the non-memory portion Ai between the second memory portion 420B and the third memory portion 420C. As the degree of device integration increases, the thicknesses of the interlayer insulation layers 413a, 413b, 413c, 413d and 413e decrease, and accordingly, the gate voltage applied to the adjacent second gate electrode layer 412b and third gate electrode layer 413b may generate electric fields that extend in the z-direction to switch or alter the polarization state of the non-memory portion Ai.

The error may occur, for example, when remanent polarization of a first orientation is stored in the non-memory portion Ai and remanent polarization of a second, opposite orientation is stored in a memory portion adjacent to a non-memory portion Ai. The remanent polarization stored in the non-memory portion Ai may change the orientation of the remanent polarization stored in part or all of the adjacent memory portion. Accordingly, the reliability of signal information stored in the adjacent memory portion may degrade.

In contrast, in a nonvolatile memory device according to embodiments of the present disclosure, as described above, the memory portions of the first functional layer for each memory cell can be isolated from each other. Accordingly, it is possible to avoid the development of remanent polarization in the non-memory portion of the first functional layer positioned between the plurality of memory portions. As a result, the reliability of signal information stored in the plurality of memory portions of the first functional layer can be improved.

Figure 28:
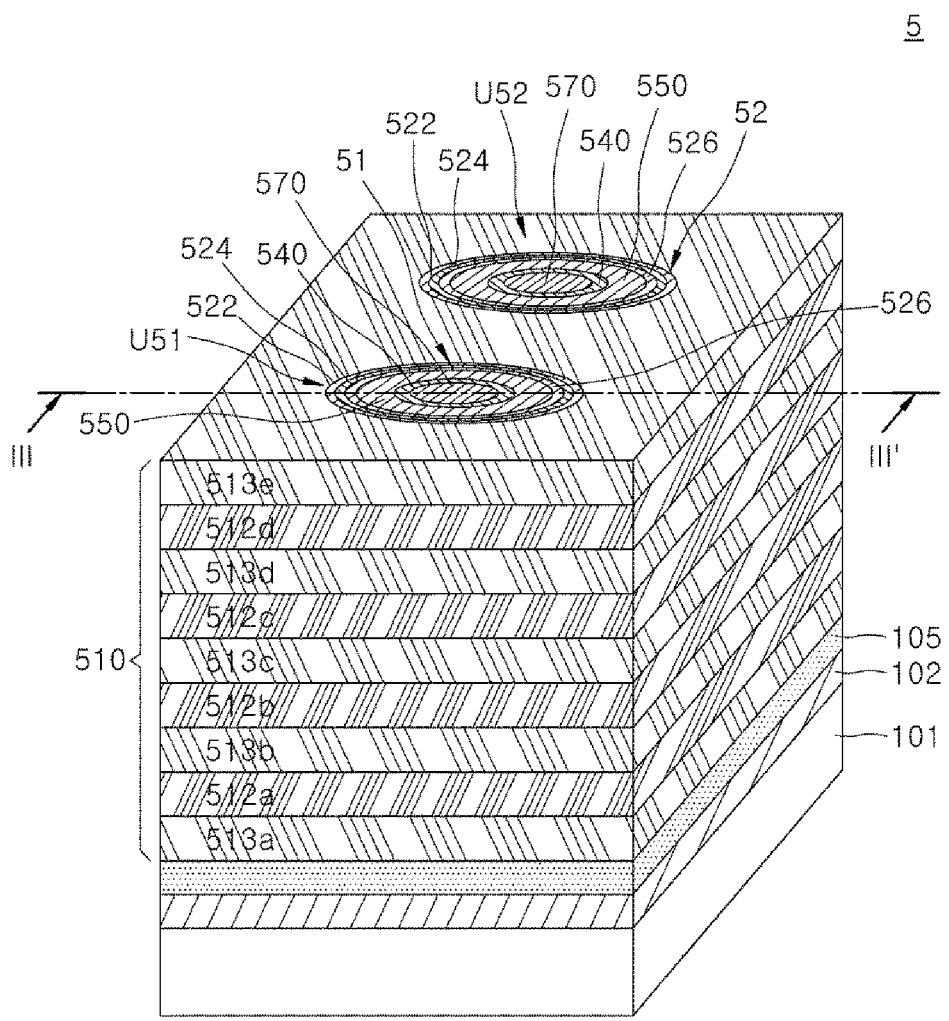
FIG. 28 is a perspective view schematically illustrating a nonvolatile memory device according to a further embodiment of the present disclosure.
Figure 29:
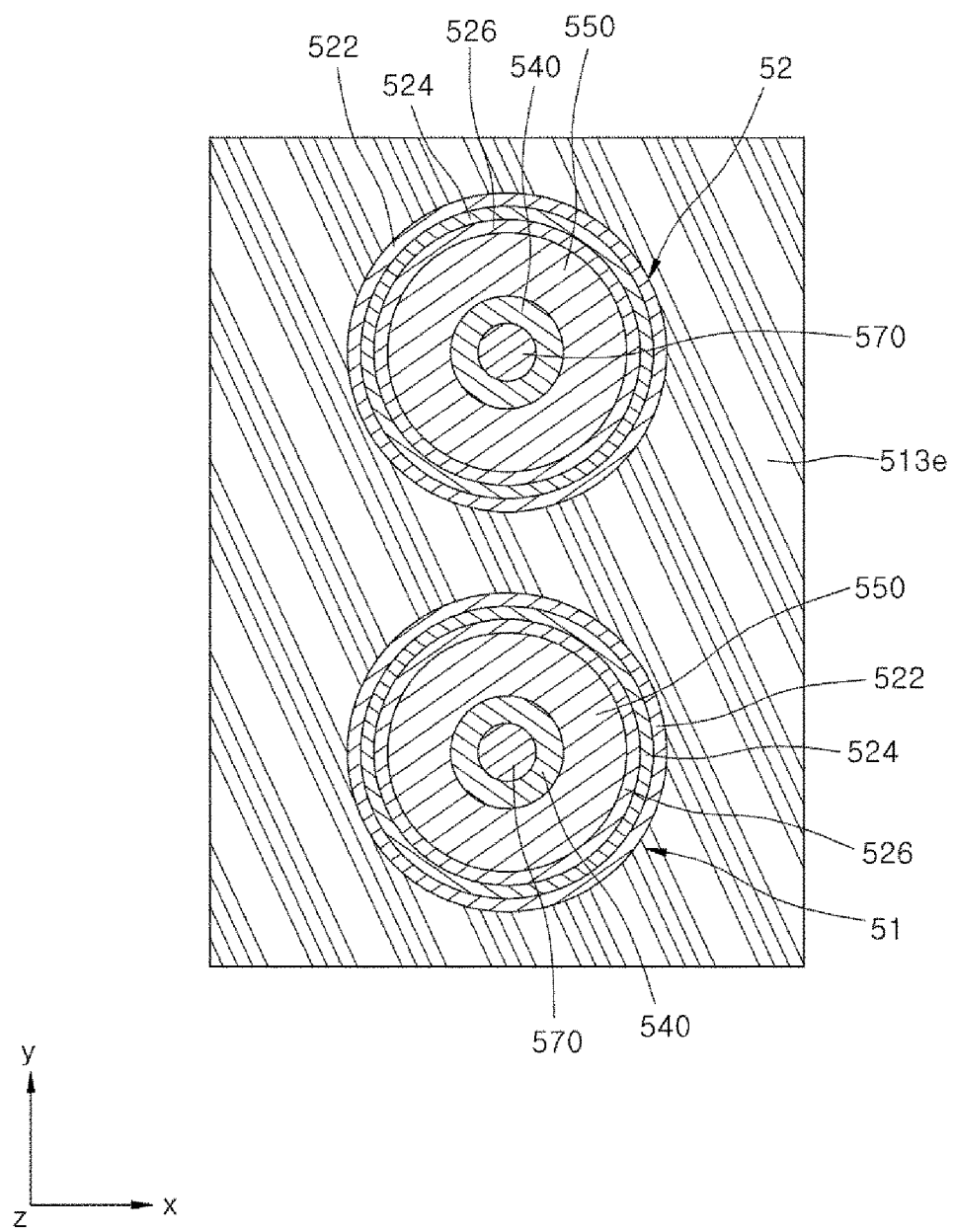
FIG. 29 is a plan view of the nonvolatile memory device of FIG. 28.
Figure 30:
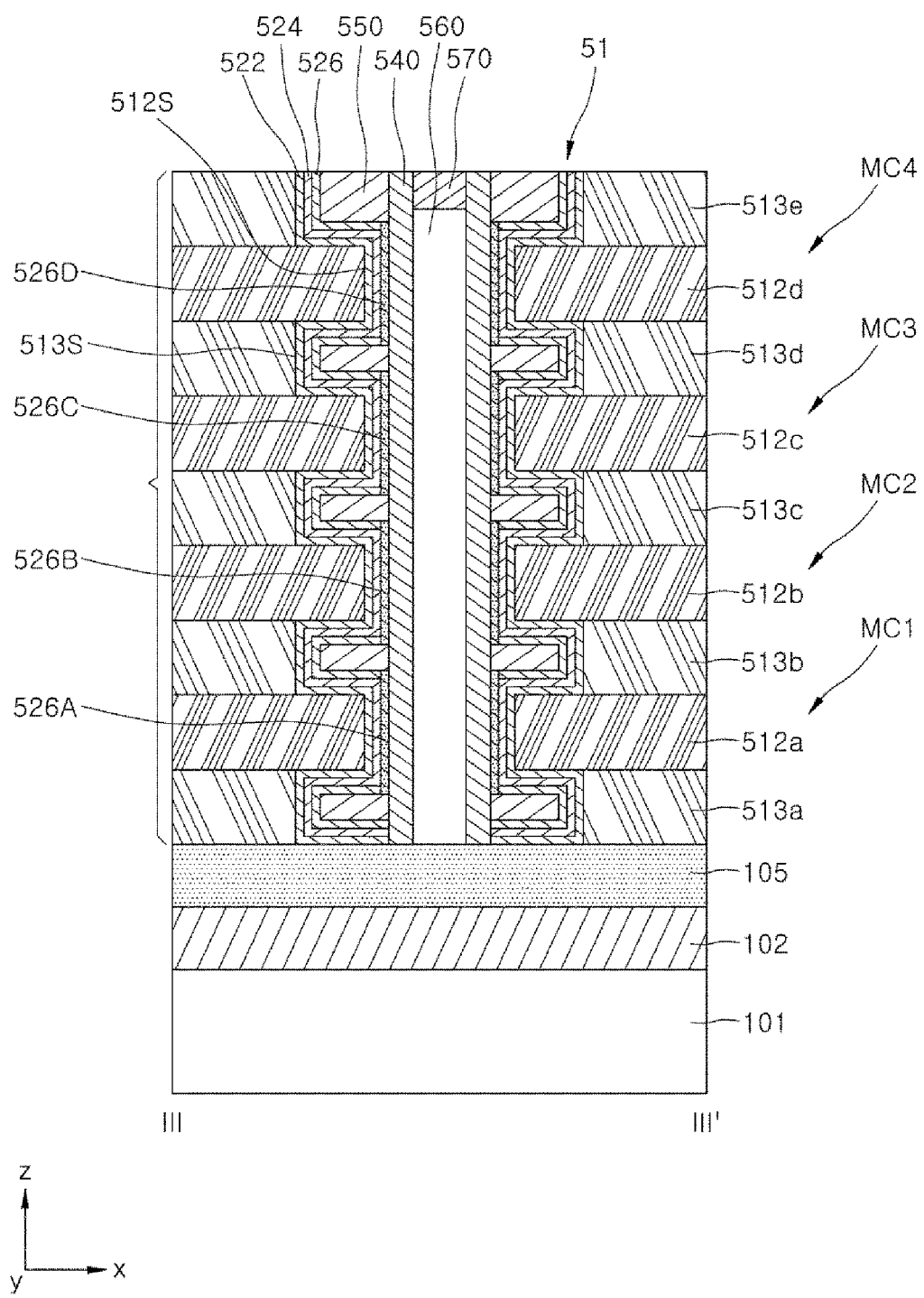
FIG. 30 is a cross-sectional view taken along a line III-III' of the nonvolatile memory device of FIG. 28.

FIG. 28 is a perspective view schematically illustrating a nonvolatile memory device according to a further embodiment of the present disclosure. FIG. 29 is a plan view of the nonvolatile memory device of FIG. 28. FIG. 30 is a cross-sectional view taken along a line DI-DI' of the nonvolatile memory device of FIG. 28.

Referring to FIGS. 28 to 30, a nonvolatile memory device 5 may be a NAND flash memory device. In the nonvolatile memory device 5, the configuration and structures, except for first to third functional layers 522, 524 and 526, may be substantially the same as those of the nonvolatile memory device 1, which is a resistance change memory device described above with reference to FIGS. 1 to 3.

The nonvolatile memory device 5 may include a substrate 101, a gate structure 510 that is disposed on or over the substrate 101 and includes hole patterns 51 and 52, first functional layers 522 disposed along sidewall surfaces of the gate structure 510 inside the hole patterns 51 and 52, second functional layers 524 disposed on the first functional layers 522 inside the hole patterns 51 and 52, and third functional layers 526 disposed on the second functional layers 524 inside the hole patterns 51 and 52. The gate structure 510 may include first to fourth gate electrode layers 512a, 512b, 512c and 512d and first to fifth interlayer insulation layers 513a, 513b, 513c, 513d and 513e, which are alternately stacked. The first to fourth gate electrode layers 512a, 512b, 512c and 512d protrude toward the center of each of the hole patterns 51 and 52, compared with the first to fifth interlayer insulation layers 513a, 513b, 513c, 513d and 513e, so that the sidewall surface of the gate structure 510 may have an uneven or curved shape in the hole patterns 51 and 52.

The nonvolatile memory device 5 may include first and second memory element units U51 and U52 that are distinguished from each other by the hole patterns 51 and 52. The first and second memory element units U51 and U52 may be operated independently of each other.

The nonvolatile memory device 5 may include a channel layer 540 extending in the z-direction on the substrate 101. The channel layer 540 may be disposed to contact first to fourth cell portions 526A, 526B, 526C and 526D of the third functional layer 526. The first to fourth cell portions 526A, 526B, 526C and 526D of the third functional layer 526 may indirectly cover the sidewall surfaces 512S of the corresponding first to fourth gate electrode layers 512a, 512b, 512c and 512d, respectively. That is, the first to fourth cell portions 526A, 526B, 526C and 526D of the third functional layer 526 may face the sidewall surfaces 512S of the protruding first to fourth gate electrode layers 512a, 512b, 512c and 512d, with the first functional layer 522 and the second functional layer 524 interposed therebetween. Referring to FIG. 30, a portion of the first functional layer 522 may be disposed to contact the sidewall surfaces 512S of the first to fourth gate electrode layers 512a, 512b, 512c and 512d, and a portion of the second functional layer 524 may be disposed to contact the portion of the first functional layer 522 that contacts the sidewall surfaces 512S. The first to fourth cell portions 526A, 526B, 526C and 526D of the third functional layer 526 may be disposed to contact portions of the second functional layer 524.

In addition, the nonvolatile memory device 5 may have a gap filling layer 550 in a region adjacent to the channel layer 540. The gap filling layer 550 may be disposed between the channel layer 540 and a non-contact portion of the third functional layer 526 with the channel layer 540.

The nonvolatile memory device 5 may further include core insulation structures 560 disposed inside each of the hole patterns 51 and 52, in which the first to third functional layers 522, 524 and 526, the channel layer 540, and the gap filling layer 550 are disposed. The nonvolatile memory device 5 may further include a channel lower contact layer 105 that is disposed between the substrate 101 and the gate structure 510 and contacts one end of the channel layer 540. The channel lower contact layer 105 may be electrically connected to a source electrode (not illustrated). The nonvolatile memory device 5 may further include a base insulation layer 102 disposed between the substrate 101 and the channel lower contact layer 105.

The nonvolatile memory device 5 may further include a channel upper contact layer 570 disposed on the core insulation structure 560. The channel upper contact layer 570 may contact the other end of the channel layer 540. For example, the channel upper contact layer 570 may respectively contact the other end of the channel layer 540 disposed in a direction perpendicular to the substrate (i.e., the z-direction) from the one end of the channel layer 540.

In the embodiment, the first functional layer 524 may be a charge barrier layer. The second functional layer 526 may be a charge storage layer. The third functional layer 526 may be a charge tunneling layer. Referring to FIG. 30, the nonvolatile memory device 5, which is a NAND type flash memory device, may include first to fourth memory cells MC1, MC2, MC3 and MC4 connected in series to each other in the vertical direction. In the embodiment, the first to fourth cell portions 526A, 526B, 526C and 526D of the third functional layer 525 may be isolated from each other along the z-direction. Accordingly, during device operation, when the electric charge flowing along the channel layer 540 tunnels to the charge storage layer 524 by the voltage applied to the gate electrode layer, the phenomenon in which the tunneling electric charges electrically interfere with other neighboring memory cell portions can be avoided. Accordingly, the reliability of a write operation into a memory cell and the reliability of stored signal information can be improved.

Figure 31:
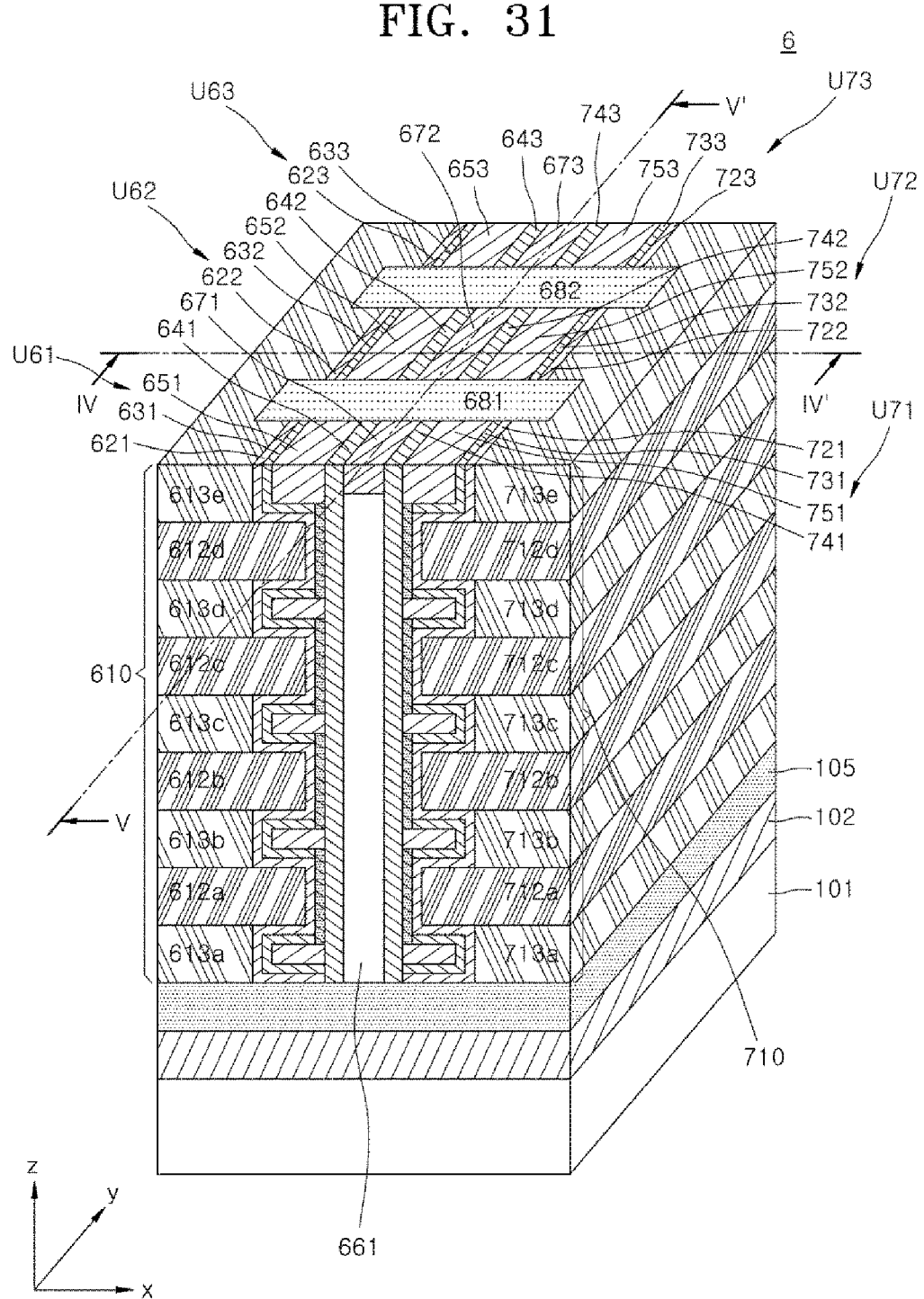
FIG. 31 is a perspective view schematically illustrating a nonvolatile memory device according to a yet further embodiment of the present disclosure.
Figure 32:
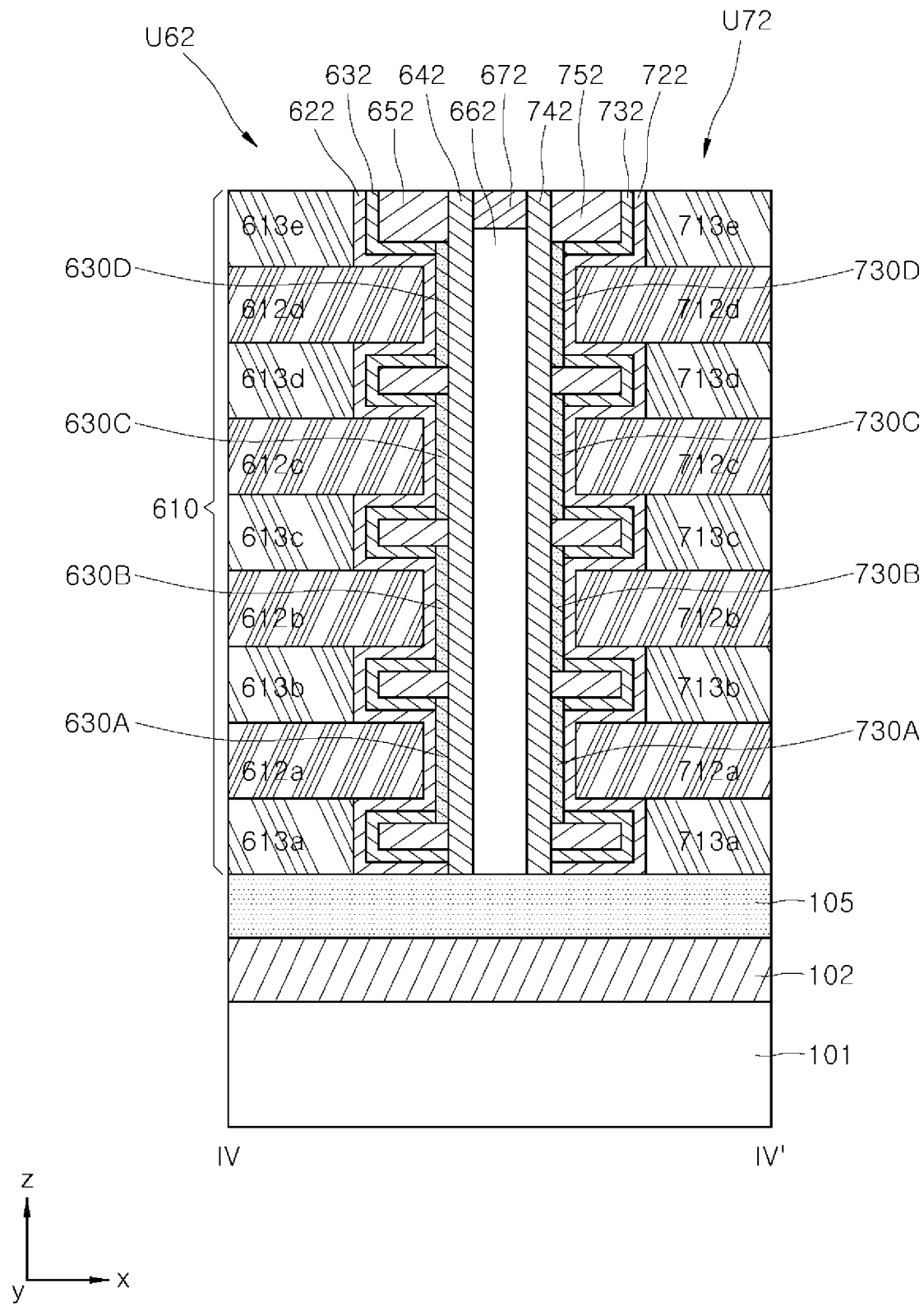
FIG. 32 is a cross-sectional view taken along a line IV-IV' of the nonvolatile memory device of FIG. 31.
Figure 33:
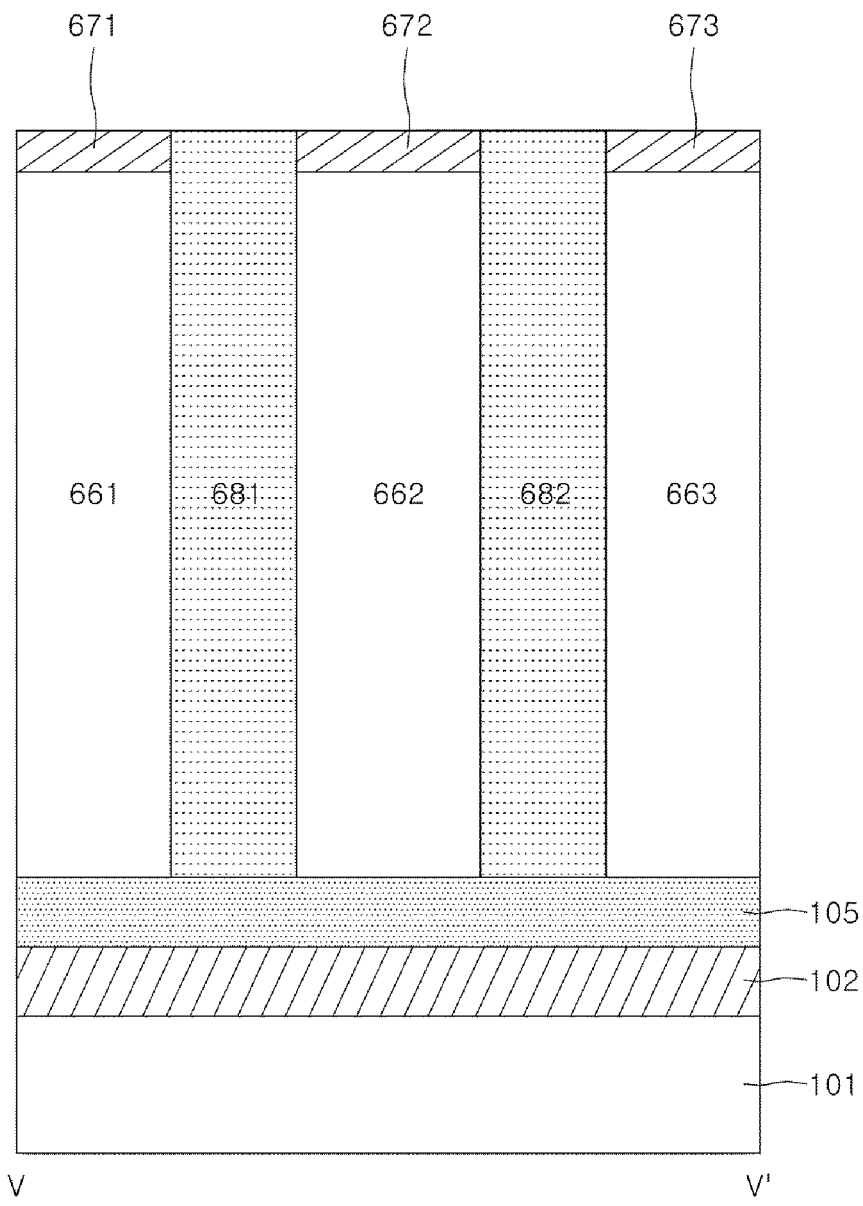
FIG. 33 is a cross-sectional view taken along a line V-V' of the nonvolatile memory device of FIG. 31.

FIG. 31 is a perspective view schematically illustrating a nonvolatile memory device according to a yet further embodiment of the present disclosure. FIG. 32 is a cross-sectional view taken along a line IV-IV' of the nonvolatile memory device of FIG. 31. FIG. 33 is a cross-sectional view taken along a line V-V' of the nonvolatile memory device of FIG. 31. A nonvolatile memory device 6 may include first to sixth memory element units U61, U62, U63, U64, U65 and U66, which are distinguished from each other by cell isolation structures 681 and 682. The first to sixth memory element units U61, U62, U63, U64, U65 and U66 may be operated independently of each other.

Referring to FIGS. 31 to 33, the nonvolatile memory device 6 may include a substrate 101 and first and second gate structures 610 and 710 disposed on the substrate 101. The first gate structure 610 may include first to fourth gate electrode pattern layers 612a, 612b, 612c and 612d and first to fifth interlayer insulation layers 613a, 613b, 613c, 613d and 613e, which are alternately stacked along a first direction (i.e., the z-direction) perpendicular to the substrate 101. The first gate structure 610 may extend in a second direction (i.e., the y-direction) perpendicular to the first direction. The first to fourth gate electrode pattern layers 612a, 612b, 612c and 612d may protrude in a third direction (i.e., the x-direction) perpendicular to the first and second directions relative to the first to fifth interlayer insulation layers 613a, 613b, 613c, 613d and 613e. Similarly, the second gate structure 710 may include first to fourth gate electrode pattern layers 712a, 712b, 712c and 712d and first to fifth interlayer insulation layers 713a, 713b, 713c, 713d and 713e, which are alternately stacked along the first direction (i.e., the z-direction) perpendicular to the substrate 101. The second gate structure 710 may extend in the second direction (i.e., the y-direction) perpendicular to the first direction. The first to fourth gate electrode pattern layers 712a, 712b, 712c and 712d may protrude in a third direction (i.e., the x-direction) perpendicular to the first and second directions in relation to the first to fifth interlayer insulation layers 713a, 713b, 713c, 713d and 713e.

The nonvolatile memory device 6 may include first functional layers 621, 622 and 623 disposed on the substrate 101 along one sidewall surface of the first gate structure 610 and second functional layers 631, 632 and 633 disposed on the first functional layers 621, 622 and 623, respectively. In addition, the nonvolatile memory device 6 may include channel layers 641, 642 and 643 that extend in the first direction (i.e., the z-direction) on the substrate 101 and are disposed to contact first to fourth cell portions 630A, 630B, 630C and 630D of the second functional layers 631, 632 and 633, respectively. The configuration of the channel layers 641, 642 and 643 may be substantially the same as the configuration of the channel layer 140 of the nonvolatile memory device 1 described above with reference to FIGS. 1 to 3. Gap filling layers 651, 652 and 653 may be disposed in spaces between the channel layers 641, 642 and 643 and non-contact portions of the second functional layers 631, 632 and 633, which do not contact the channel layers 641, 642 and 643.

In addition, channel upper contact layers 671, 672 and 673 may be disposed to contact the channel layers 641, 642 and 643, respectively. The first functional layers 621, 622 and 623, the second functional layers 631, 632 and 633, the channel layers 641, 642 and 643, and the channel upper contact layers 671, 672 and 673 may be separated from each other by cell isolation structures 681 and 682 with respect to the second direction (i.e., the y-direction).

Likewise, the nonvolatile memory device 6 may include first functional layers 721, 722 and 723 disposed on the substrate 101 along one sidewall surface of the second gate structure 710 and second functional layers 731, 732 and 733 disposed on the first functional layers 721, 722 and 723, respectively. In addition, the nonvolatile memory device 6 may include channel layers 741, 742 and 743 that extend in the first direction (i.e., the z-direction) on the substrate 101 and are disposed to contact first to fourth cell portions 730A, 730B, 730C and 730D of the second functional layers 731, 732 and 733, respectively. The configuration of the channel layers 741, 742 and 743 may be substantially the same as the configuration of the channel layer 140 of the nonvolatile memory device 1 described above with reference to FIGS. 1 to 3. Gap filling layers 751, 752 and 753 may be disposed in spaces between the channel layers 741, 742 and 743 and non-contact regions of the second functional layers 731, 732 and 733 that do not contact the channel layers 741, 742 and 743.

In addition, channel upper contact layers 671, 672 and 673 may be disposed to contact the channel layers 741, 742 and 743, respectively. The first functional layers 721, 722 and 723, the second functional layers 731, 732 and 733, the channel layers 741, 742 and 743, and the channel upper contact layers 671, 672 and 673 may be separated from each other by the cell isolation structures 681 and 682 with respect to the second direction (i.e., the y-direction). In addition, core insulation structures 661, 662 and 663 may be disposed between neighboring channel layers 641, 642 and 643 and channel layers 741, 742 and 743, respectively.

In addition, the nonvolatile memory device 6 may include a base insulation layer 102 and a channel lower contact layer 105 that are sequentially disposed between the substrate 101 and the first and second gate structures 610 and 710.

Referring to FIGS. 31 and 32, one sidewall surface of each of the first and second gate structures 610 and 710 may have an uneven or curved shape, and the first functional layers 621, 622, 623, 721, 722 and 723 and the second functional layers 631, 632, 633, 731, 732 and 733 may be respectively disposed in a predetermined thickness along the uneven or curved shape.

In an embodiment, the nonvolatile memory device 6 may be a resistance change memory device. In this case, the first functional layers 621, 622, 623, 721, 722 and 723 may be gate insulation layers, and the second functional layers 631, 632, 633, 731, 732 and 733 may be resistance change layers. The configurations of the first functional layers 621, 622, 623, 721, 722 and 723 and the second functional layers 631, 632, 633, 731, 732 and 733 may be substantially the same as the configurations of the first functional layer 120 and the second functional layer 130 of the nonvolatile memory device 1 described above with reference to FIGS. 1 to 3.

In another embodiment, the nonvolatile memory device 6 may be a ferroelectric memory device. In this case, the first functional layers 621, 622, 623, 721, 722 and 723 may be ferroelectric memory layers, and the second functional layers 631, 632, 633, 731, 732 and 733 may be interfacial insulation layers. The configurations of the first functional layers 621, 622, 623, 721, 722 and 723 and the second functional layers 631, 632, 633, 731, 732 and 733 may be substantially the same as the configurations of the first functional layer 320 and the second functional layer 330 of the nonvolatile memory device 3 described above with reference to FIGS. 23 to 25.

In some other embodiments not illustrated herein, the nonvolatile memory device 6 may be a NAND flash memory device. In this case, the nonvolatile memory device 6 may further include third functional layers disposed between the first functional layers 621, 622, 623, 721, 722 and 723, and the second functional layers 631, 632, 633, 731, 732 and 733. The first functional layers 621, 622, 623, 721, 722 and 723 may be charge barrier layers. The second functional layers 631, 632, 633, 731, 732 and 733 may be charge storage layers. The third functional layer may be a charge tunneling layers. The first functional layers 621, 622, 623, 721, 722 and 723, the second functional layers 631, 632, 633, 731, 732 and 733, and the third functional layers may have the same configurations as those of the nonvolatile memory device 5 described above with reference to FIGS. 28 to 30.

The configuration of the gap filling layers 651, 652, 653, 751, 752 and 753 may be substantially the same as the configuration of the gap filling layer 150 of the nonvolatile memory device 1 described above with reference to FIGS. 1 to 3. In some embodiments, the gap filling layers 651, 652, 653, 751, 752 and 753 are disposed adjacent to an air gap in a manner substantially similar to the gap filling layer 151 and the air gap 152 of the nonvolatile memory device 1a described above with reference to FIG. 10. In some embodiments, the gap filling layers 651, 652, 653, 751, 752 and 753 may be substantially similar to the gap filling layer 153 of the nonvolatile memory device 1b described above with reference to FIG. 10.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A nonvolatile memory device comprising:
a substrate;
a gate structure disposed on the substrate and including a hole pattern, the gate structure including at least one gate electrode layer and at least one interlayer insulation layer, which are alternately stacked, wherein the gate electrode layer protrudes toward a center of the hole pattern relative to the interlayer insulation layer;
a first functional layer disposed along a sidewall surface of the gate structure inside the hole pattern;
a second functional layer disposed on the first functional layer inside the hole pattern; and
a channel layer extending in a direction perpendicular to the substrate inside the hole pattern and disposed to contact a cell portion of the second functional layer,
wherein the cell portion of the second functional layer indirectly covers a sidewall surface of the gate electrode layer.

2. The nonvolatile memory device of claim 1, further comprising a gap filling layer disposed between the channel layer and a non-cell portion of the second functional layer.

3. The nonvolatile memory device of claim 2, wherein the gap filling layer comprises substantially the same material as the channel layer.

4. The nonvolatile memory device of claim 2, further comprising a core insulation structure filling the hole pattern in which the first and second functional layers, the channel layer and the gap filling layer are disposed.

5. The nonvolatile memory device of claim 2, further comprising an air gap disposed between the gap filling layer and the non-cell portion of the second functional layer.

6. The nonvolatile memory device of claim 1, wherein the first functional layer comprises a gate insulating material, and the second functional layer comprises a variable resistance material.

7. The nonvolatile memory device of claim 6, wherein the variable resistance material comprises a movable oxygen vacancy or a movable metal ion.

8. The nonvolatile memory device of claim 6, wherein the variable resistance material comprises a phase change material.

9. The nonvolatile memory device of claim 1, wherein the first functional layer comprises a ferroelectric material, and the second functional layer comprises an interfacial insulating material.

10. The nonvolatile memory device of claim 1, further comprising a third functional layer disposed between the second functional layer and the channel layer,
wherein the first functional layer is a charge barrier layer, the second functional layer is a charge storage layer, and the third functional layer is a charge tunneling layer.

11. A nonvolatile memory device comprising:
a substrate;
a gate structure disposed on the substrate, the gate structure including at least one gate electrode pattern layer and at least one interlayer insulation layer, which are alternately stacked along a first direction perpendicular to the substrate, wherein the gate electrode pattern layer extends in a second direction perpendicular to the first direction, wherein the gate electrode pattern layer protrudes in a third direction perpendicular to the first and second directions relative to the interlayer insulation layer;
a first functional layer disposed on the substrate along a sidewall surface of the gate structure;
a second functional layer disposed on the first functional layer; and
a channel layer extending in the first direction and disposed to contact a cell portion of the second functional layer,
wherein the cell portion of the second functional layer indirectly covers a sidewall surface of the gate electrode pattern layer.

12. The nonvolatile memory device of claim 11, further comprising a cell insulation structure disposed to extend in the first direction on the substrate and separating the first and second functional layers and the channel layer with respect to the second direction.

13. The nonvolatile memory device of claim 11, wherein the first functional layer comprises a gate insulating material, and the second functional layer comprises a variable resistance material.

14. The nonvolatile memory device of claim 13, wherein the variable resistance material comprises a movable oxygen vacancy or a movable metal ion.

15. The nonvolatile memory device of claim 13, wherein the variable resistance material comprises a phase change material.

16. The nonvolatile memory device of claim 11, wherein the first functional layer comprises a ferroelectric material, and the second functional layer comprises an interfacial insulating material.

17. The nonvolatile memory device of claim 11, further comprising a third functional layer disposed between the second functional layer and the channel layer,
wherein the first functional layer is a charge barrier layer, the second functional layer is a charge storage layer, and the third functional layer is a charge tunneling layer.

18. The nonvolatile memory device of claim 11, further comprising a gap filling layer disposed between the channel layer and a non-cell portion of the second functional layer.

19. The nonvolatile memory device of claim 18, wherein the gap filling layer comprises substantially the same material as the channel layer.

20. The nonvolatile memory device of claim 18, further comprising an air gap disposed between the gap filling layer and the non-cell portion of the second functional layer.

* * * * *